(12) United States Patent
Stine et al.

(10) Patent No.: US 6,795,952 B1
(45) Date of Patent: Sep. 21, 2004

(54) SYSTEM AND METHOD FOR PRODUCT YIELD PREDICTION USING DEVICE AND PROCESS NEIGHBORHOOD CHARACTERIZATION VEHICLE

(75) Inventors: Brian E. Stine, Santa Clara, CA (US); David M. Stashower, Los Gatos, CA (US); Sherry F. Lee, San Jose, CA (US); Kurt H. Weiner, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 122 days.

(21) Appl. No.: 10/130,448

(22) PCT Filed: Nov. 17, 2002

(86) PCT No.: PCT/US00/31528

§ 371 (c)(1),
(2), (4) Date: Nov. 20, 2000

(87) PCT Pub. No.: WO01/37150

PCT Pub. Date: May 25, 2001

Related U.S. Application Data

(63) Continuation-in-part of application No. 09/442,699, filed on Nov. 18, 1999, now Pat. No. 6,449,749.
(60) Provisional application No. 60/166,307, filed on Nov. 18, 1999, and provisional application No. 60/166,308, filed on Nov. 18, 1999.

(51) Int. Cl.[7] .......................... G06F 9/45; G06F 17/50
(52) U.S. Cl. .............................................. 716/5; 716/4
(58) Field of Search .................. 716/4, 5; 714/733, 714/734

(56) References Cited

U.S. PATENT DOCUMENTS 3,751,647 A    8/1973  Maeder et al. ......... 235/151.11
4,835,466 A    5/1989  Maly et al. .............. 324/158 R
5,703,381 A   12/1997  Iwasa et al. ................... 257/48
5,773,315 A    6/1998  Jarvis ........................... 438/14
6,124,143 A    9/2000  Sugasawara ................. 438/18

OTHER PUBLICATIONS

D.J.Hannaman et al., "Fault Chip Defect Characterization for Wafer Scale Integration," Proc. IEEE 1990 Int '1 Conference on Microelectronic Test Structures, vol. 3, pp. 67–71.*

H.R.Sayah et al., "Comb/Serpentine/Cross–Bridge Test Structure for Fabrication Process Evaluation," 1988 IEEE Proc. on Microelectronic Test Structures, vol. 1, No. 1 pp. 23–28.*

C.H.Stapper et al., "Integrated Circuit Yield Management and Yield Analysis: Development and Implementation," IEEE Trans. on Semiconductor Manufacturing, vol. 8, No. 2, pp. 95–102.*

(List continued on next page.)

*Primary Examiner*—Leigh M. Garbowski
(74) *Attorney, Agent, or Firm*—Duane Morris LLP; Steven E. Kofps; William H. Murray

(57) ABSTRACT

A system and method for predicting yield of integrated circuits includes a characterization vehicle (12) having at least one feature representative of at least one type of feature to be incorporated in the final integrated circuit, preferably a device neighborhood, process neighborhood characterization vehicle. The characterization vehicle (12) is subjected to process operations making up the fabrication cycle to be used in fabricating the integrated circuit in order to produce a yield model (16). The yield model (16) embodies a layout as defined by the characterization vehicle (12) and preferably includes features which facilitates the gathering of electrical test data and testing of prototype sections at operating speeds. An extraction engine (18) extracts predetermined layout attributes (26) from a proposed product layout (20). Operating on the yield model, the extraction engine (18) produces yield predictions (22) as a function of layout attributes (26) and broken down by layers or steps in the fabrication process (14).

20 Claims, 11 Drawing Sheets-

OTHER PUBLICATIONS

Khare et al., "Extraction of Defect Characteristics for Yield Estimation Using the Double Bridge Test Structure", VLSITSA, pp 428–432, 1991.

Khare et al., "Yield Oriented Computer–Aided Defect Diagnosis", IEEE Trans on Semiconductor Manufacturing, vol. 8, No. 2, pp 1950296, May 1995.

Nurani et al., "In–Line Yield Prediction Methodologies Using Patterned Water Inspection Information" IEEE Trans on Semiconductor Manufacturing, vol. 11, No. 1, pp 40–47, Feb. 1998.

Maly, W., "Modeling of Lithography Related Yield Losses for DAC of VSLI Circuits", IEEE Trans on CAD, pp 161–177, July 1985.

Nag and Maly, "Yield Estimation of VLSI Circuits", Tech-Con90, Oct. 1990, San Jose, CA.

Nag and Maly, "Hierarchical Extraction of Critical Area for Shorts in Very Large ICs", Proc f IEEE International Workshop on Detect and Fault T lerance in VSLI Systems, IEEE Computer Society Press, pp 10–18, 1995.

Bubel et al. "AFFCCA: A Tool for Critical Area Analysis with Circular Defects and Lithography Deformed Layout", Proc of IEEE International Workshop on Detect and Fault Tolerance in VLSI Systems, IEEE Computer Society Press, pp. 19–27, 1995.

Ouyang and Maly, Efficient Extraction of Critical Area in Large VLSI ICs, Proc IEEE International Symposium on Semiconductor Manufacturing, pp 301–304, 1996.

Ouyang et al., "Extraction of Critical Area for Opens in Large VLSI Circuits", Proc IEEE International Workshop on Defect and Fault Tolerance of VLSI Systems, pp 21–29, 1996.

Maly, "Yield Models—Comparative Study", Defect and Fault Tolerance in VLSI Systems, pp 15–31, 1990.

Stapper, "Modeling of Integrated Circuit Defect Sensitivities", IBM J. Res. Develop. vol. 27, No. 6, Nov. 1983.

Khare et al., "Extraction of Defect Size Distribution in an IC Layer Using Test Structure Data" IEEE Trans on Semiconductor Manufacturing, vol. 7, No. 3, Aug. 1994.

* cited by examiner

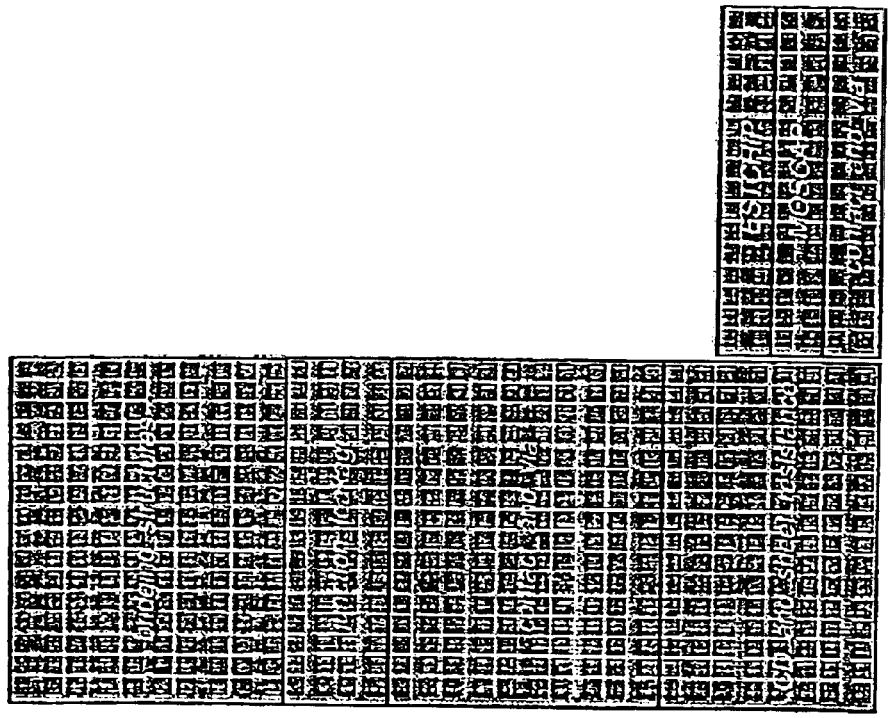
FIG. 5
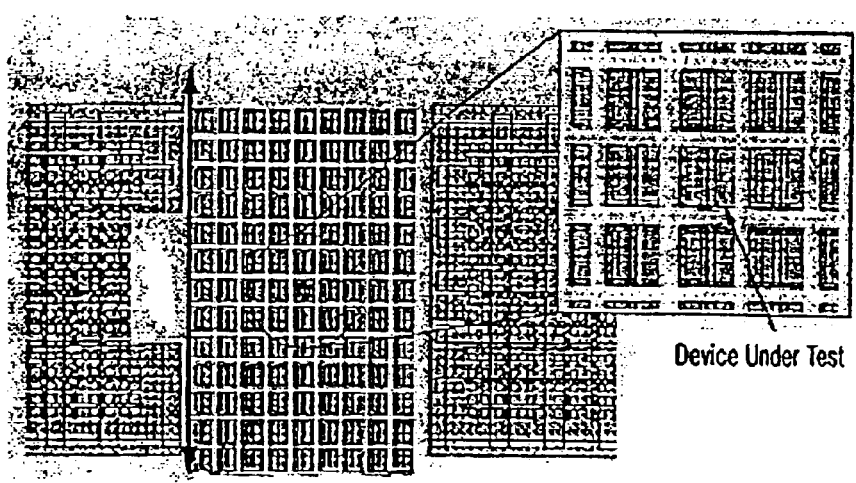
FIG. 6B
Device Under Test
FIG. 6A $y=9.8349x^{-2.0514}$  $[x-1]s+[x-2]w$

SYSTEM AND METHOD FOR PRODUCT YIELD PREDICTION USING DEVICE AND PROCESS NEIGHBORHOOD CHARACTERIZATION VEHICLE

This application is a Continuation in Part of U.S. patent application Ser. No. 09/442,699, filed Nov. 18, 1999 now U.S. Pat. No. 6,449,749. This application claims the benefit of U.S. Provisional Application 60/166,307, filed Nov. 18, 1999, and U.S. Provisional Application 60/166,308, filed Nov. 18, 1999.

BACKGROUND OF THE INVENTION

The present invention pertains to fabrication of integrated circuits and more particularly to systems and methods for improving fabrication yields.

Silicon based integrated circuit technology, which has evolved into submicron line widths, is now able to produce chips containing millions of circuit elements. The process is extremely complex, requiring a large number of process steps to produce multi-level patterns of semiconductor, metals, and insulator types of materials. The circuits are interconnected by metal lines created in multilevel geometries through a large number of very small via holes. Every process step produces three dimensional statistical variations in the geometry and the materials properties of the final configuration. Such statistical variations, which include systematic and/or random defects, can result in both yield and performance degradation of the product Yield and performance detractors can be found to vary across a chip, across the wafer and from wafer to wafer.

The initial design simulations for an integrated circuit chip, along with expert knowledge of the process capabilities generate a standard cell library that defines the standard device logic, memory and analog unit cells, and the design rules that define the limits and the desired dimensions of the multi-layer film and active device structures. This information is used to generate a mask set for the production of an integrated circuit product. A set of manufacturing process specifications is also generated which describes in detail the multitude of processes associated with each mask level. The mask generated for each process level defines the two dimensions parallel to the Si substrate, i.e. the planar dimensions of each processed layer. The manufacturing process specifications then determine the materials and their properties as well as the third dimension normal to the Si substrate, e.g. diffusion depths, metal thickness, and the thickness of thermally grown and deposited oxides.

For a new chip design there may be a number of iterations before an acceptable product process is defined for stable production. These iterations can include both changes to the mask set and the manufacturing specifications. The classic s-shaped "learning curve" is a generally accepted concept that models the manufacturing cycle for the release of such high technology type products. The initial flat section of the curve represents the initial trials of the design and process, and generally is considered to represent essentially a very low and inconsistent yield output regime. In this initial stage, some changes to the manufacturing process specifications can be made in order to stabilize the process well enough to obtain a finite but consistent yield result. The so called "ramp up," section of the manufacturing cycle is the section where yield of the product is consistent and is increasing rapidly. The end of the "learning curve" is relatively flat where the product yield is flat and stable. At this stage, the cost of the product is essentially determined by the yield, because all the manufacturing costs are relatively fixed. It is well known that the manufacturing cost of the first two sections of this learning cycle are extremely high because of the amortized cost of multi-billion dollar manufacturing facilities, as well as the cost of highly skilled personnel. Thus, a profit greater than zero must be realized at some point of the "ramp up" cycle, and the projected business profit generally occurs at the beginning of the fixed yield cycle.

For the past thirty years, the integrated circuit technology has been increasing the density of circuits at an exponential rate. This has been accomplished by deceasing the characteristic 'line width" to sub-micron dimensions. Because of this, the economic requirements for the introduction of new products, as well as the maintenance of existing products, have now reached a level of great concern, because they represent very significant cost factors for the industry.

In general, the initial design phases of integrated circuits are optimized with respect to yield and performance factors through the use of elaborate simulation programs rather than through extensive process variations. The driving force for the use of simulation programs rather than the use of process variations is the much higher relative cost to manipulate the process steps.

Elegant simulation programs have also been written in an attempt to correlate classes of observed defects with the design rules and the process steps in order to provide statistically based yield models for integrated circuit products. For example, attempts have been made to predict the yield distributions in a chip, given the data from the mask set. Although these programs have contributed to the knowledge base of the integrated circuit technologies, it has been difficult for such programs to have a direct effect on the yield and performance of a new or established product. This is because it is extremely difficult for a program to represent a class of integrated circuit products when there is an extremely wide variation in the resulting designs. A case in point is the variation in large assemblies of random logic with respect to the distribution of (multi-level) line lengths, shapes, and via holes in the interconnection scheme of a particular design. It is therefore difficult for such simulation models to take into account this unpredictable variability. One concludes that the art, with respect to simulation programs, has been useful in the creation of the initial product design, but has not proven to be very effective at optimizing the learning curve or enhancing the performance of the original design.

Integrated circuit chips all undergo an extensive test procedure at the wafer level. Such product testers, which are extremely expensive, are designed primarily to test for functionality. Only the nominal performance of the chip can be measured using these results since the probe contact configuration, as well as the limiting capability of the measuring circuits, prevent an accurate measurement of nanosecond switching speeds that can occur during the normal operation the chip. Further, product testers are not able to measure a large number of worst case line and via paths, or worst case gate logic fan-in and fan-out situations in order to evaluate the critical factors of the product design. Therefore, product testers cannot determine the cause of large yield variations when they occur, nor can they provide sufficient information that will lead to the improvement of the existing yield or performance of an integrated circuit product.

The prior art has addressed this problem through the creation of process monitoring circuits that are incorporated within the product chip and utilize the scribe line area, (or the area between the bonding pads) within the chip reticle. Such test configurations are commonly referred to as a "Scribe Line Monitor" (SLM). Early versions of such monitors attempted to extrapolate AC behavior through DC tests made on the test configurations through the use of simulation models. The more recent art has developed AC test methods using internal circuits within the SLM, e.g. ring oscillators and multiplexing functions that can generate limited performance and yield tests of the representative elements. In these cases it is found that the density of circuits in the SLM are not adequate to represent the behavior of a large assembly of dense circuits found on the product chip because of certain optical effects of the masks combined with the photolithography process. U.S. Pat. No. 5,703,381, Iwasa, et al., attempted to alleviate this problem by making connections to test transistors that were shared within the product configuration. Other SLM designs included circuits that contain some combinations of line lengths and via holes, chosen to represent some worst case situations that affect circuit delays. Some designs include a number of inverter gates in series for the purpose of measuring, the average switching time of the logic elements. U.S. Pat. No. 6,124,143, Sugasawara, has also included representations of lines and via holes on more than one level.

The attempts to predict yields through simulation programs, or on chip testing methods, have been made with varying degrees of success. Thus, there is a need for an improved system and method for integrated circuit product yield prediction.

SUMMARY OF THE INVENTION

A characterization vehicle includes a single die, including a device neighborhood testing module for allowing measurement of variations in electrical performance of an active device due to a first plurality of process variations within the active device, and a second plurality of process variations affecting an area surrounding the active device. The device neighborhood testing module includes at least one active test device and an array of dummy devices, within which the active test device is located.

BRIEF DESCRIPTION OF THE DRAWINGS

FIG. 5 is a plan view of the PN CV shown in FIG. 3.

FIG. 6A shows a device under test in the DN CV of FIG. 4, surrounded by dummy devices.

FIG. 6B is an enlarged view of a detail of FIG. 6A.

DETAILED DESCRIPTION

U.S. patent application Ser. No. 09/442,699, filed Nov. 18, 1999, U.S. Provisional Patent Application 60/166,307, filed Nov. 18, 1999, and U.S. Provisional Patent Application 60/166,308, filed Nov. 18, 1999 are all hereby incorporated by reference herein in their entireties.

A key element of the exemplary embodiment of the invention is a separate chip or Device Neighborhood/Process Neighborhood Characterization Vehicle (DN/PN CV) that can comprehensively represent any given manufacturing process for various families of integrated circuits. The DN/PN CV provides a means to make meaningful measurements of the critical factors in the manufacturing process which determine the yield and performance of the product.

Further, the DN/PN CV provides a means to significantly shorten the time dependence of the first two sections of the "learning curve" described above. The DN/PN CV can be used to increase the yield and performance of an integrated circuit product in the case where it has progressed to the final stage of its product cycle. In general, the DN/PN CV is able to be used in the product cycle at any stage of its development in order to provide yield and/or performance enhancements. Therefore, the DN/PN CV provides a new approach with regard to the solution of the most critical problems encountered in the development and the manufacturing of sub micron integrated circuit technologies.

The DN module allows testing of the impact on device performance a first plurality of process variations affecting the device and a second plurality of process variations affecting other devices surrounding the device to be analyzed. Analogously, the PN module allows testing of the impact on structure electrical characteristics of a first plurality of process variations affecting the structure, and the simultaneous effect of a second plurality of process variations of the other surrounding structures. (The structures may include, for example, combs, snakes and the like.)

Figure 1:
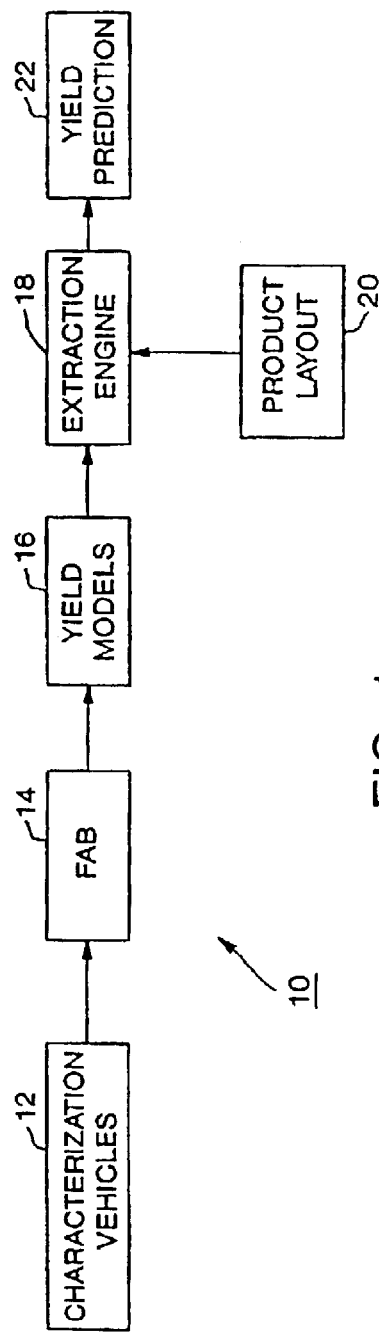
FIG. 1 is a block diagram depicting the steps performed by a preferred embodiment of the system of the present invention.

Referring now to FIG. 1, there is shown a block diagram depicting the steps performed by a system, generally designated 10, for predicting integrated circuit yields in accordance with the present invention. The system 10 utilizes at least one type of characterization vehicle 12. The characterization vehicle 12 preferably is in the form of software containing information required to build an integrated circuit structure which incorporates at least one specific feature representative of at least one type of feature to be incorporated into the final product. For example, the characterization vehicle 12 might define a test vehicle which can characterize selected lithographic layers for probing the health and manufacturability of the metal interconnection module of the process flow under consideration. The structures need to be large enough and similar enough to the actual product or type of products running in the fabrication process to enable a reliable capture or fingerprint of the various maladies that are likely to affect the product during the manufacturing process. The characterization vehicle 12 defines features which match one or more attributes of the proposed product layout. For example, the characterization vehicle 12 might define a CV module having a layout which includes features which are representative of the proposed product layout (e.g. examples of line size, spacing and periodicity; line bends and runs; etc.) in order to determine the maladies likely afflicting those specific design types and causing yield loss.

The CV 12 might also define one or more active regions and neighboring features of the proposed design in order to explore impact of layout neighborhood on device performance and process parameters; model device parameters as a function of layout attributes; and determine which device correlate best with product performance.

In addition to providing information for assessing and diagnosing yield problems likely to be seen by the product (s) under manufacture, the characterization vehicle is designed to produce yield models 16 which can be used for accurate yield prediction. These yield models 16 can be used for purposes including, but not limited to, product planning, prioritizing yield improvement activities across the entire process, and modifying the original design of the product itself to make it more manufacturable.

The majority of the test structures in the characterization vehicle 12 contemplated in the invention are designed for electrical testing. To this end, the reliability of detecting faults and defects in the modules evaluated by each characterization vehicle is very high. Inspection equipment cannot deliver or promise this high degree of reliability. Furthermore, the speed and volume of data collection is very fast and large respectively since electrical testing is fast and cheap. In this way, statistically valid diagnosis and/or yield models can be realized.

The characterization vehicle 12 is preferably in the form of a GDS 2 layout on a tape or disc which is then used to produce a reticle set. The reticle set is used during the selected portions of the fabrication cycle 14 to produce the yield model 16. Thus the yield model 16 is preferably constructed from data measured from at least a portion of a wafer which has undergone the selected fabrication process steps using the reticle set defined by the characterization vehicle 12.

The yield model 16 not only embodies the layout as defined by the characterization vehicle, it also includes artifacts introduced by the fabrication process operations themselves. The yield model 16 may also include prototype architecture and layout patterns as well as features which facilitate the gathering of electrical test data and testing prototype sections at operating speeds which enhances the accuracy and reliability of yield predictions.

An extraction engine 18 is a tool for extracting layout attributes from a proposed product layout 20 and plugging this information into the yield model 16 to obtain a product yield prediction 22. Such layout attributes might include, for example, via redundancy, critical area, net length distribution, and line width/space distribution. Then, given layout attributes from the proposed product layout 20 and data from yield models 16 which have been fabricated based upon information from the characterization vehicles 12, product yield 22 is predicted. Using the system and method of the present invention, the predictable product yield obtainable can be that associated with each defined attribute, functional block, or layer, or the resultant yield prediction for the entire product layout.

Figure 2:
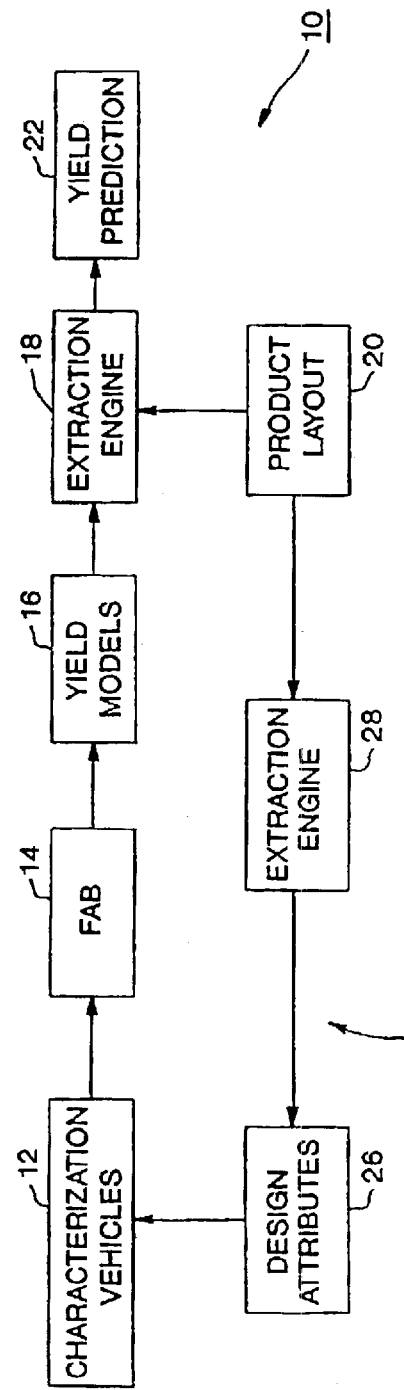
FIG. 2 is a block diagram depicting additional steps performed by the system of the present invention to effect a feedback loop.

Referring now to FIG. 2, there is shown a block diagram of the system for predicting integrated circuit yields 10 in accordance with the present invention additionally comprising a feedback loop, generally designated 24, for extracting design attributes 26 from product layout 20 by means of extraction engine 28. In accordance with this feature of the present invention, the characterization vehicle 12 is developed using attributes of the product layout 20. In this case, attributes of the product layout are extracted, making sure that the range of attributes are spanned in the characterization vehicle 12. For example, the product layout is analyzed to determine line space distribution, width distribution, density distribution, the number of island patterns, in effect developing a subset of the entire set of design rules of the fabrication process, which subset is applicable to the particular product layout under consideration. With respect to patterns, the product layout analysis would determine the most common pattern, the second most common pattern, and so forth. These would be extracted by the extraction engine 28 yielding design attributes 26 encompassing all of these patterns for inclusion into the characterization vehicle 12. With respect to densities, if the analysis of the product layout reveals that the density of a first metal is from 10% to 50%, then the characterization vehicle would include the entire range of 10% to 50% for the first metal.

Figure 3:
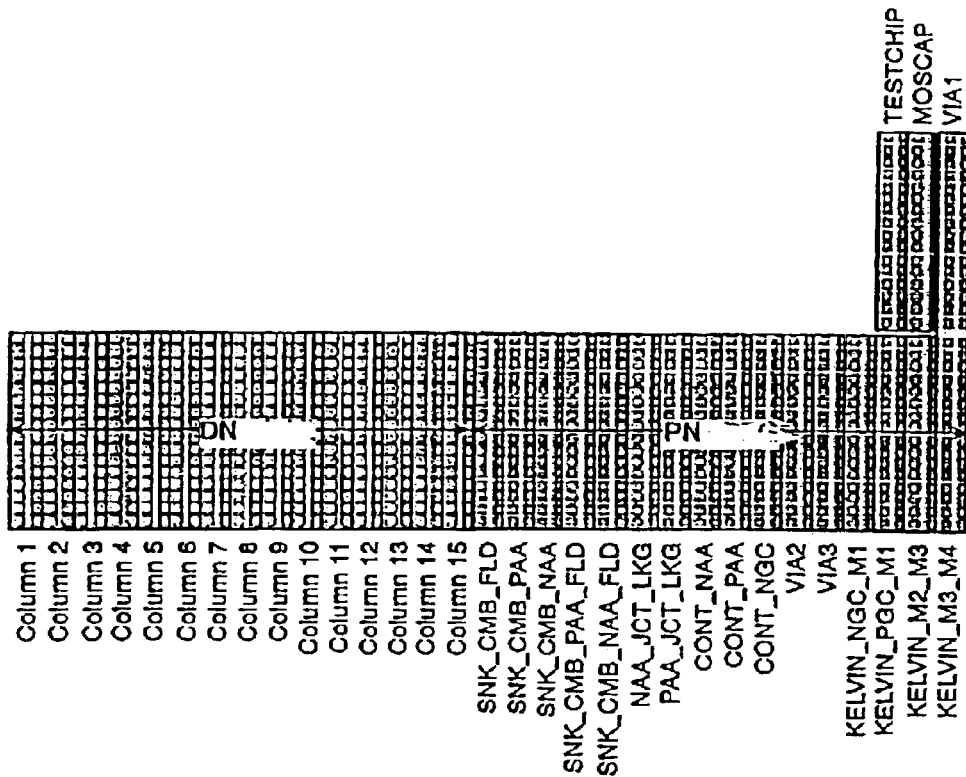
FIG. 3 is a plan view of a Device Neighborhood/Process Neighborhood (DN/PN) characterization vehicle (CV) according to the present invention.

FIG. 3 shows a layout of the DN/PN CV test vehicle that includes the device neighborhood and process neighborhood test engineering groups (DN and PN CVs), and other special structure modules. The device neighborhood (DN) subsection incorporates 200 or more discreet NMOS and PMOS transistor structures. The purpose of the DN CV is to quantify the impact of within die pattern variations on the performance of the transistor. Placing the test devices within an array of dummy transistors derives the local pattern dependencies. The principal variants in the DN CV are polysilicon and active area density. In addition, special structures are included to investigate the impact of contact and gate spacing.

The PN CV portion of the design is typically comprised of 17 or more submodules. The area containing these modules represents a size comparable to a large portion of a product chip. The purpose of these modules is to measure the impact of within die pattern variations on systematic yield loss associated with bridging, junction leakage, CD line width variation and contact and via formation. Like the DN CV, the PN CV accomplishes pattern-dependent characterization by varying the local process environment around the test structures. In this manner, the PN CV can effectively simulate the within-die pattern dependent process variations expected during normal manufacturing. By accounting for the effects of the process neighborhood, both the DN and PN CVs offer a much more comprehensive vehicle for debugging and ramping processes into production. Separate from the CVs, a special structure module provides a vehicle to characterize well and channel profiles as well as N+ and P+ sheet resistances, while other structures focuss on the effects of contact to gate spacing.

2.0 DN/PN CV Floorplan and Description

In this section, the floorplan and basic description of each module of the DN/PN CV is described. Detailed descriptions of each module discussed in this section can be found in section 3.

As is shown in FIG. 3, the DN/PN CV test chip is composed of four major modules, the DN, PN, CV's MOSCAP and TESTCHIP . . . . The DN module measures the variation in electrical device performance as a function of local process environment. The DN module is split into two types submodules: NMOS and PMOS and three process effects sub-modules: poly variant, active_variant, and special_structure.

Figure 4:
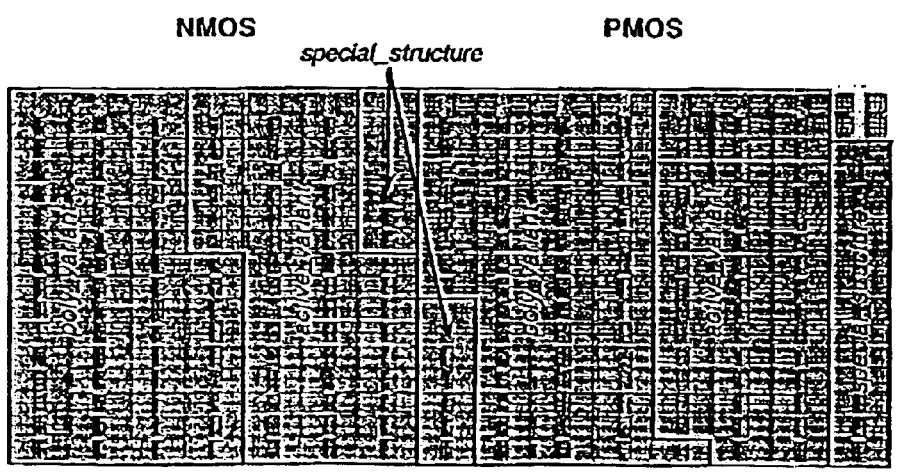
FIG. 4 is a plan view of the DN CV shown in FIG. 3.

FIG. 4 is a plan view of the DN CV. The poly variant submodule quantifies the relationship between polysilicon density and electrical device performance. Both macro_ and micro_effects are studied. Similar to the poly variant module, the active_variant structures study the influence of active_area density on the electrical performance of the transistor. Finally, in the special_structures module, the effects of contact_to_poly, contact_to_contact and poly_to_poly spacing are studied along with the influence of contact size.

The PN test vehicle, shown in FIG. 5, is split into four types of effects modules: bridging_structures, CD (critical dimension),_and_sheet_resistance, junction_leakage, and contact_and_via. The bridging_structures devices consist of five modules which investigate poly_to_poly bridging on field oxide, poly_to_active bridging (N and P) and poly_to_ poly bridging due to stringers at the field oxide edge (N and P). The CD_and_sheet_resistance structures measure CD control (e.g. line width), and sheet resistance of active (N+ and P+), gate (N+ and P+), and metal 1, metal 2, metal 3 and metal 4 interconnection layers. In total, this part of the chip encompasses 4 sub-modules and 62 individual test structures, The junction_leakage section is composed of 2 modules with a total of 24 devices, which quantify the area leakage of N+ and P+ active as well as the perimeter leakage for active area bounded by gate and field. Finally, the contact_and_via submodule is directed at establishing guidelines for all contact and via formation for the four_layer metal process. This section consists of six sub-modules containing a total of 90 test structures.

The MOSCAP and TESTCHIP modules, also shown in FIG. 5, contain specialty devices that measure the active sheet resistance and well_ and channel_profiles as well as structures to determine the yield impact of contact to poly gate spacing.

3.0 Module and Structure Description

In this section, the composition and structure of the DN PN CV is discussed. The DN and PN CVs, MOSCAP and TESTCHIP modules are addressed in Sections 3.1 through 3.4, respectively. Section 4 provides specific device locations, pad definitions and measurement parameters.

3.1 DN CV

The purpose of the DN CV is to measure the effects of the local process environment on the final electrical performance of an MOS transistor. This is accomplished by placing the device under test in a "sea" of dummy devices which can be tailored to provide specific values for parameters such as poly and active area density. An example of such a layout is provided in FIG. 6. In this figure, a large area of filled with dummy structures. The device under test is located at the center of the array of dummy devices. In this manner, the local process environment is effectively controlled. The DN module is composed of two type modules, NMOS and PMOS, which are identical in composition and consist of three effects sub-modules, poly variant, active_variant, and special_structure. Each sub-module is described in detail in Sections 3.1.1 through 3.1.3 below.

3.1.1 Poly_Variant

Figure 7:
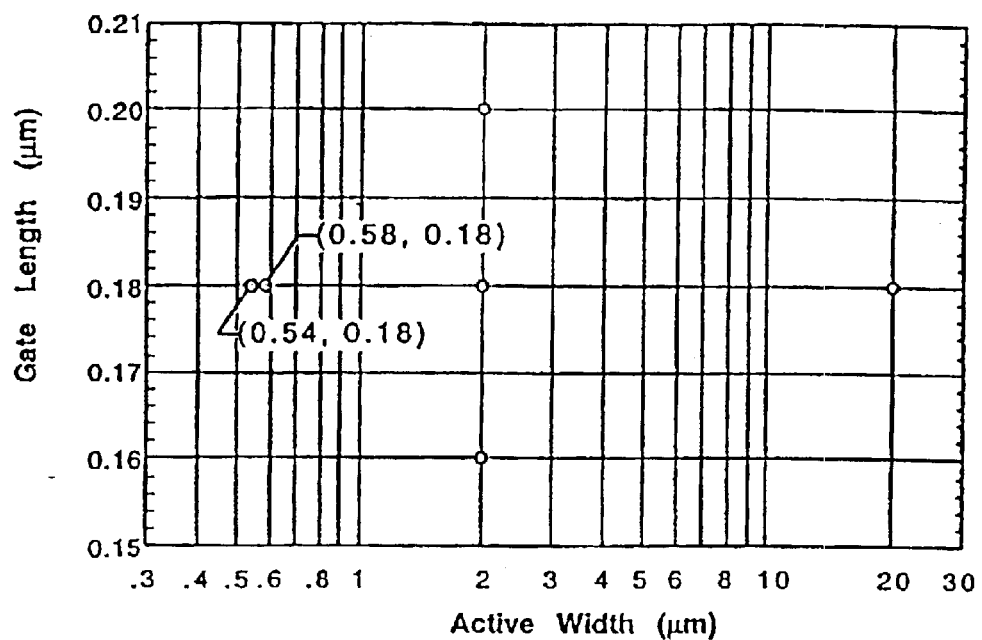
FIG. 7 is a diagram of typical DOE (design of experiments) variables for gate length and active width in the DN CV of FIG. 4.

Polysilicon etch loading can potentially impact final circuit performance by creating unanticipated and un-testable variation in the gate length within the die due to both macro and micro-density effects. The poly variant module incorporates 54 transistor structures in a design of experiments (DOE) that investigates the impact of micro_and macro-polysilicon density on gate length as a function of gate length and width. The DOE for gate length and active width is summarized in FIG. 7. Six sets of transistors incorporate these gate/active_width variations and form another designed experiment in which the macroscopic polysilicon density is varied. Macroscopic variations are produced by tailoring the length and width of the gate on the dummy transistors within each test structure, while the micro-density effects are controlled by varying the number of gate fingers which are in close proximity. The list of approximate polysilicon densities and multi-gate variations is provided in Table 1.

TABLE 1

| No. of Fingers | Orientation | Poly Density |
| --- | --- | --- |
| 1 | Horizontal | −6–8% |
| 1 | Vertical | −6–8% |
| 1 | Vertical | −2–3% |
| 1 | Vertical | −9–13% |
| 1 | Vertical | −13–15% |

Figure 8:
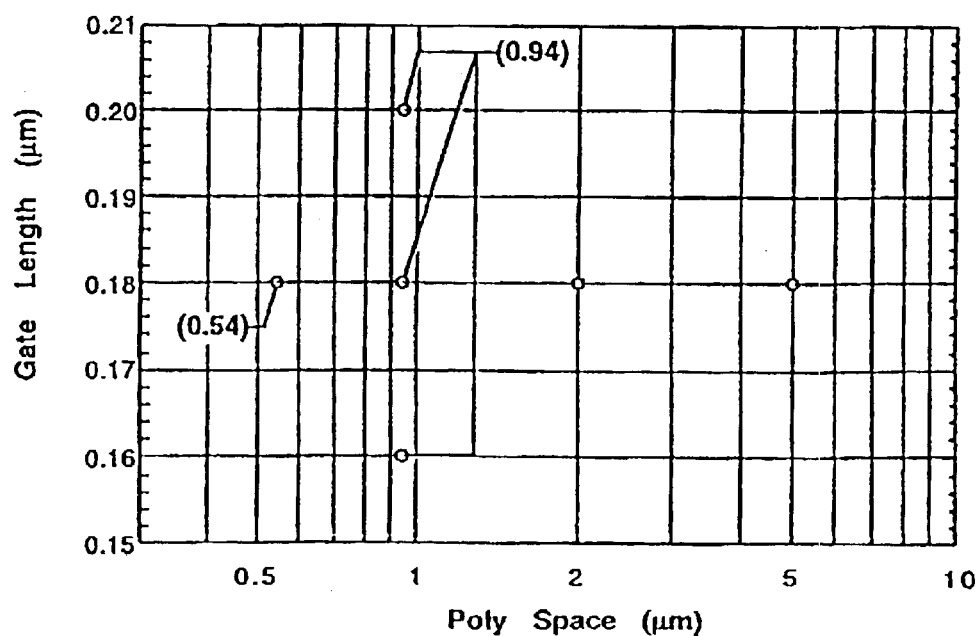
FIG. 8 is a diagram of a typical DOE variables for the gate length and poly spacing for poly gate devices in the DN CV of FIG. 4.

In addition to the macroscopic loading effects, micro-loading during the gate etch is investigated by the use of multi-gate structures. In this experiment, the active width is kept constant at 2 $\mu$m while the gate length, gate spacing and number of gates is varied according to FIG. 8. The effects of macro-loading are also investigated by again varying the local polysilicon density. The polysilicon density variations for the multi-finger structures is shown in Table 2. Table 2 lists Target polysilicon densities for polysilicon multi-gateDOE in the PN-CV module.

TABLE 2

| NO. OF FINGERS | ORIENTATION | POLY DENSITY |
| --- | --- | --- |
| 2 | Vertical | −5% |
| 3 | Vertical | −5% |
| 3 | Vertical | −10% |

3.1.2 Active_Variant

Figure 9A:
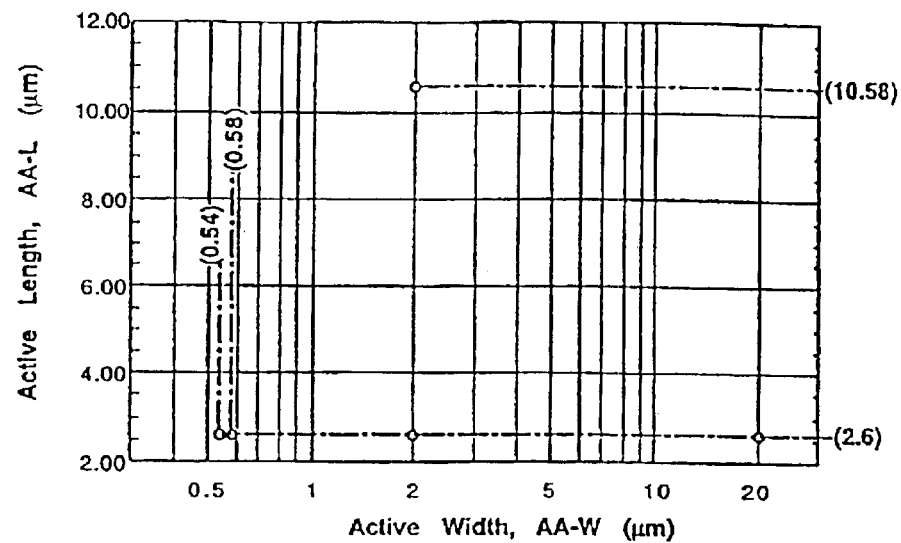
FIGS. 9A and 9B are diagrams showing a typical (DOE) for the active area including the active width and length, and the active area spacing for the DN CV of FIG. 4.
Figure 9B:
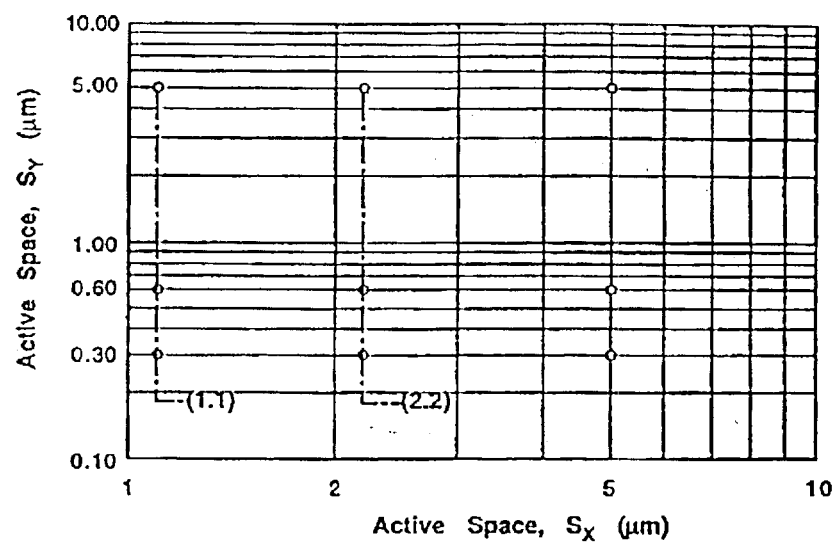
Figure 9C:
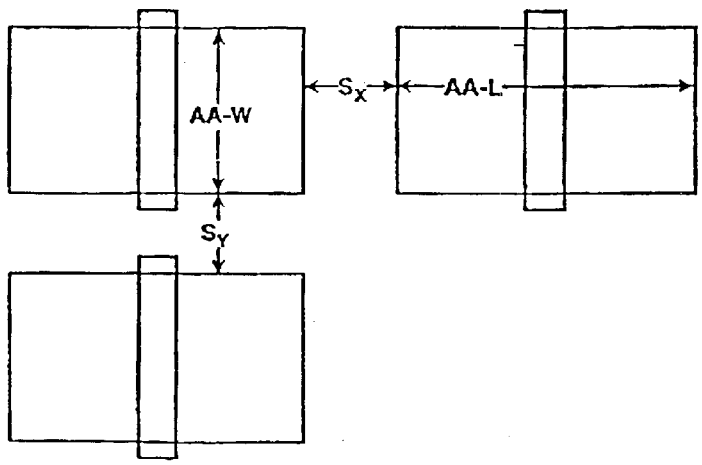
FIG. 9C is a representation of the structural dimensions referred to in 9A and 9B for the DN CV of FIG. 4.

Active etch loading can potentially impact final circuit performance by creating unanticipated and un-quantifiable variations in the shallow_trench_isolation profiles. These variations can manifest themselves in systematic yield loss due to poly-bridging, excessive leakage, etc. The active variant module incorporates 45 transistor structures in a design of experiments (DOE) that investigates the impact of active density on device performance as a function of gate length and width. The DOE for gate length and active width is summarized in FIGS. 9A and 9B. The active density is controlled by tailoring the X and Y spacing on the dummy transistors within each test structure. The DOE of active spacings, Sx and Sy, is given in FIG. 9C. For this set of test structures the gate length of the dummy transistors is fixed.

3.1.3 Special_Structures

Figure 10A:
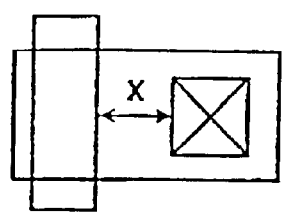
FIGS. 10A–10C show special structures for the measurements referenced in Table 3 in the DN CV of FIG. 4.
Figure 10B:
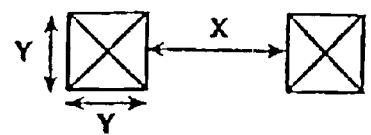
Figure 10C:
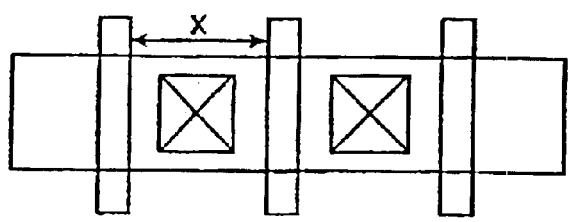

In addition to polysilicon and active area density, the DN CV investigates the effects of contact-to-poly, contact-to-contact and poly-to-poly spacings, as well as the impact of contact size. This DOE is contained with the special_structures module. The specifics of the variations are listed in Table 3 and FIGS. 10A–10C. Table 3 provides a Summary of a DOE for critical dimensions of the special structure and devices in the PN-CV module

TABLE 3

| STRUCTURE | ATTRIBUTES | TOTAL NO. OF STRUCTURES | REF. FIG. |
|---|---|---|---|
| Contact to Poly Spacing | X1 = DR, 1.1 DR, 1.2 DR | 10 | 10 |
| Contact to Contact Spacing | X2 = DR, 1.1 DR, 1.2 DR | 10 | 10 |
| Contact Size | Y = DR, 1.1 DR, 1.2 DR | 10 | 10 |
| Space Between Poly Fingers | X3 = DR, 2 DR, 2.5 DR | 10 | 10 |
| | DR = Design Rules | 10 | 10 |

Figure 18:
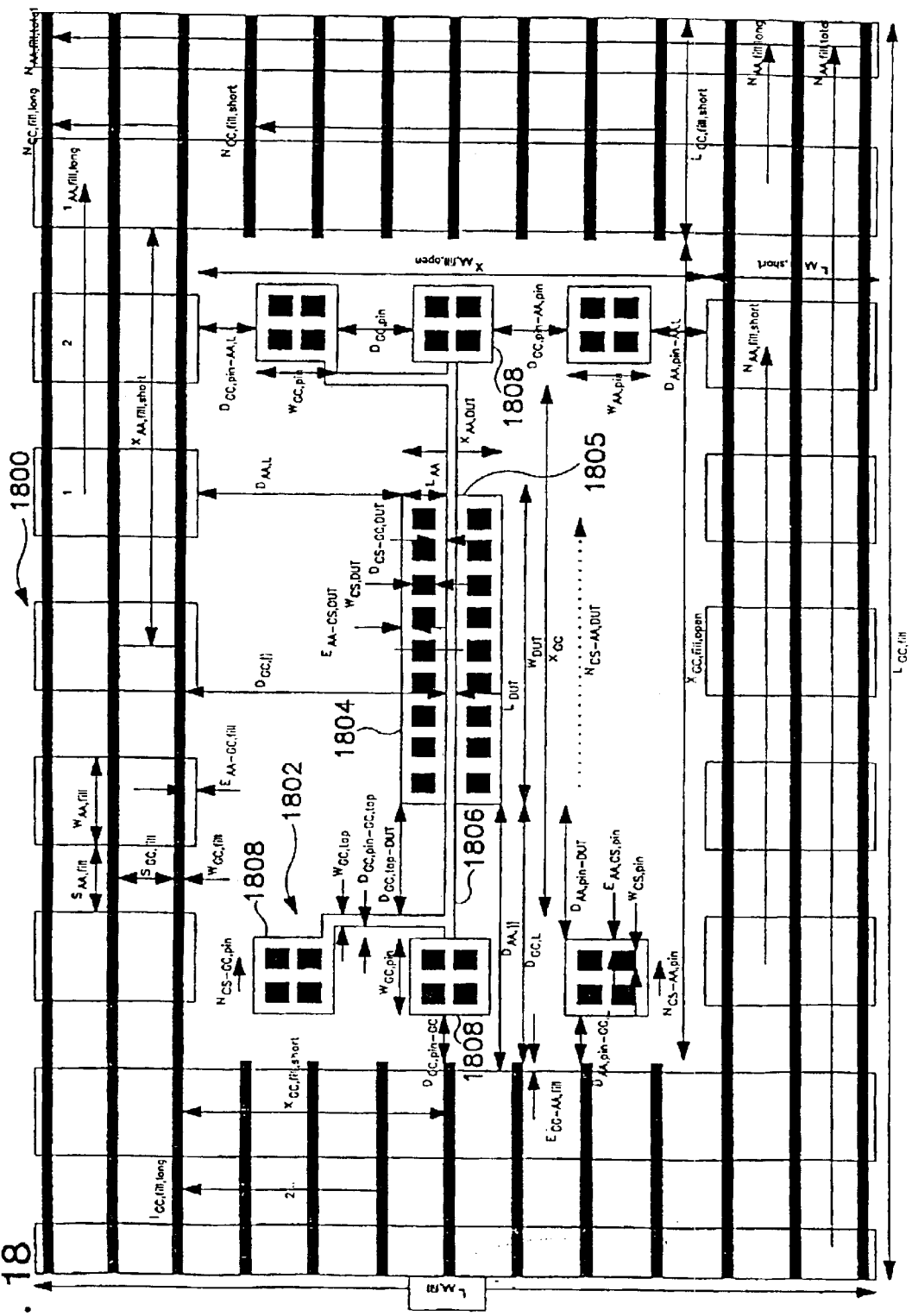
FIG. 18 is a detailed schematic diagram of a basic device neighborhood cell.

FIG. 18 is a plan view showing a basic DN cell 1800. DN cell 1800 has a structure 1802 at its center that can be used in a device and Kelvin sheet resistance measurement, to measure a sheet resistance of the gate of the device 1804. Structure 1802 includes a stripe 1806 which is an extension of the gate 1805. Stripe 1806 has four contacts 1808 at its ends. Current is injected into two of the contacts 1808, and the voltage drop is measured across the other two contacts. The device 1804 can be tested for functionality and current can also be injected through the gate line 1805, to measure voltage drop at the ends of the gate line. This will give a measure proportional to w, which in combination with a Van der Pauw measurement, can give sheet resistance.

3.2 PN CV

Figure 11:
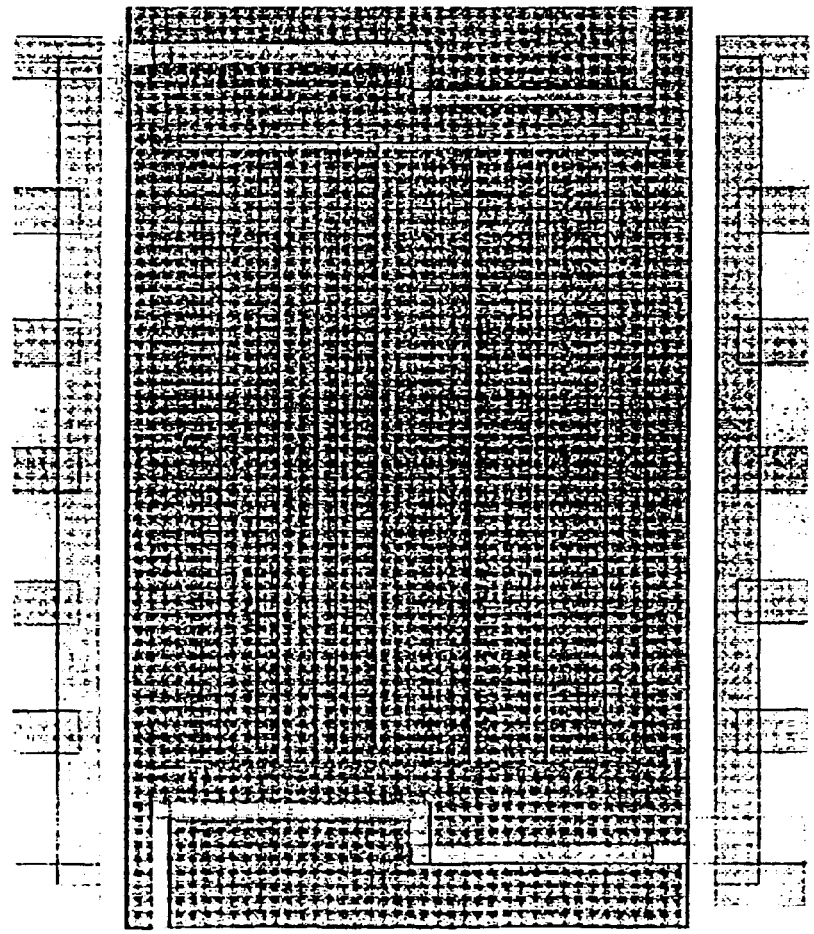
FIG. 11 is a plan view of a typical PN module which includes line width structures in PN CV of FIG. 5.

The purpose of the PN CV is to vary the environment around a given test structure to stimulate within_die pattern dependent variation. Like the DN CV, the local environment is controlled over a large area, comparable to a large area on a product chip. An example of such a layout is provided in FIG. 11. In this figure, a structure to measure line-width is surrounded by a comb-in-comb which dictates the local etch environment. By varying the line-width and space of the comb, the local process environment is effectively controlled and CD can be correlated with process layer density. In this manner, the test structure is a more accurate predictor for results on actual product.

The PN CV module is composed of four major sub-modules: bridging_structures, CD_and_sheet_resistance, junction_leakage, and contact_and_via. Each sub-module is described in detail in Sections 3.2.1 through 3.2.4 below.

3.2.1 Bridging Structures

Figure 12A:
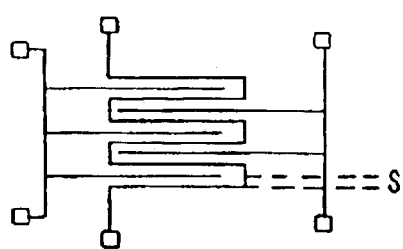
FIGS. 12A and 12B show representations of bridge and comb structures in the PN CV of FIG. 5, referenced in Table 4.
Figure 12B:
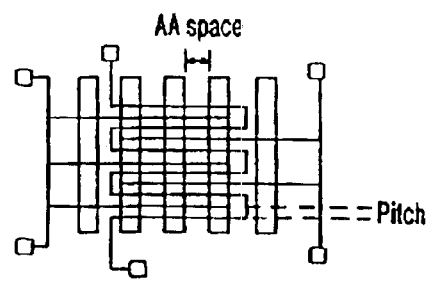

The bridging_structures module, composed entirely of snakes and combs, is incorporated to measure the effects of polysilicon and active area pitch on systematic yield loss due to polysilicon bridging. The module is divided into five sub-modules: SNK_CMB_FLD, SNK_CMB_PAA, SNK_CMB_NAA, SNK_CMB_PAA_FLD, and SNK_CMB_NAA_FLD. The SNK_CMB_FLD module looks at poly-to-poly bridging on field oxide. SNK_CMB_PAA and SNK_CMB_NAA investigate yield loss mechanisms due to polysilicon_to_active bridging across the sidewall spacer during the silicidation process. SNK_CMB_PAA_FLD and SNK_CMB_NAA_FLD focus on potential problems due to polysilicon-to-polysilicon bridging along a field edge caused by shallow trench isolation issues. Each of these sub-modules represents a DOE in which the dominant line width and space is varied. A summary of each of the modules is provided in Table 4. Visual references for the parameter definitions are provided in FIGS. 12A and 12B

TABLE 4

| STRUCTURE TYPE | ATTRIBUTES | TOTAL NO. OF STRUCTURES | REFERENCE FIG. |
|---|---|---|---|
| N + Poly on Field | L = DR, 1.1 DR, 1.2 DR, S = DR, 1.1 DR, 1.2 DR, 1.3 DR, 4 DR | 10 | 12 |
| N + Poly on AA | L = DR, 1.1 DR, 1.2 DR, 1.3 DR | 10 | 12 |
| P + Poly on AA | L = DR, 1.1 DR, 1.2 DR, 1.3 DR | 10 | 12 |
| N + Poly on Field | L = DR, 1.1 DR, 1.2 DR Pitch = DR, 1.4 DR, 6 DR AA Space = DR, 1.2 DR, 2 DR, 2.5 DR | 10 | 12 |
| P + Poly on Field and AA | L = DR, AA-L = DR Pitch = DR, 1.3 DR, 6 DR AA Space = DR, 1.1 DR, 2 DR, 2.5 DR DR = Design rules AA = Active spacing | 10 | 12 |

3.2.2 CD_and_sheet_resistance

The CD_and_sheet_resistance module is incorporated to measure the effects of etch loading on the CD of a given layer. Sheet resistance is included to provide necessary input for the line-width measurement structure. The CD_and_sheet_resistance is composed of four sub-modules: KELVIN_NGC_M1, KELVIN_M1_PGC, KELVIN_M2_M3 and KELVIN_M3_M4. Line-width structures are included for each of the interconnect layers. These include N+ poly (NGC), P+ poly (PGC), M1, M2, M3 and M4. Van der Pauw structures are included for each of the above layers as well as for N+ active (NAA) and P+ active (PAA). Table 5 provides the specifics for each of the DOEs, including a summary of CD and Sheet Resistance DOE incorporated in the PN-CV.

TABLE 5

| STRUCTURE TYPE | ATTRIBUTES | TOTAL NO. OF STRUCTURES | REFERENCE FIG. |
|---|---|---|---|
| Van der Pauw (Sheet Resistance) | N + Poly, P + Poly, P + AA M1, M2, M3, and M4 | 10 | 13 |
| N + Poly Critical Dimension (KELVIN) | L = DR, 1.1 DR, 1.2 DR S = DR, 1.1 DR, 2 DR | 8 | 13 |

TABLE 5-continued

| STRUCTURE TYPE | ATTRIBUTES | TOTAL NO. OF STRUCTURES | REFERENCE FIG. |
|---|---|---|---|
| P + Poly CD (KELVIN) | L = DR, 1.1 DR, 1.2 DR<br>S = DR, 1.1 DR, 1.3 DR | 8 | 13 |
| M1 CD (KELVIN) | L = DR, 1.1 DR, 1.2 DR<br>S = DR, 1.1 DR, 1.3 DR | 10 | 13 |
| M2, M3 CD (KELVIN) | L = DR, 1.1 DR, 1.2 DR<br>S = DR, 1.1 DR, 1.2 DR | 10/10 | 13 |
| M4 | L = DR, 1.2 DR, 1.4 DR<br>S = DR, 1.1 DR, 1.4 DR | 8 | 13 |
| Mk = metal layer k<br>CD = critical dimension | DR = design rules<br>S = spacing<br>L = line width<br>AA = active area | | |

Figure 13A:
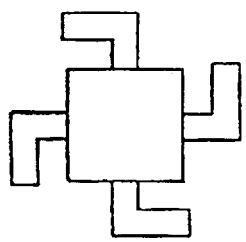
FIGS. 13A and 13B show structures for the measurement of critical dimension and sheet resistance in the PN CV of FIG. 5, referenced in Table 5.
Figure 13B:
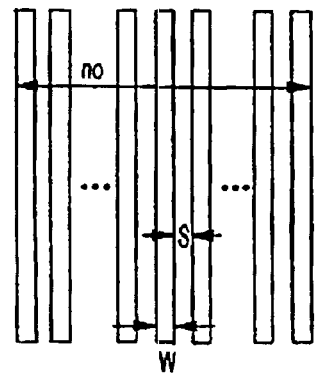
Figure 14:
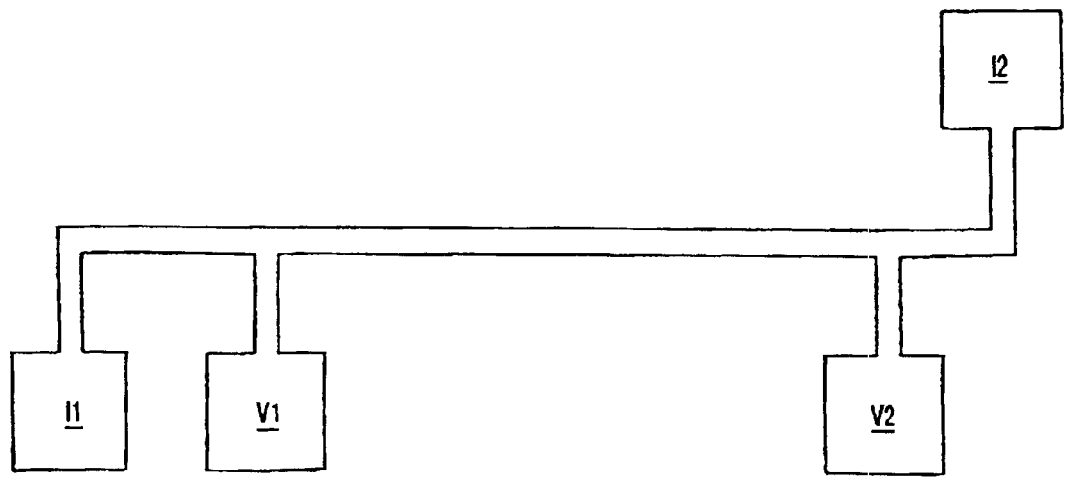
FIG. 14 is a plan view of a Kelvin structure used to measure critical dimensions in the PN CV of FIG. 5.

FIGS. 13A and 13B provide a visual definition of the parameters investigated. The structure used to measure CD is shown in FIG. 14. In this structure, a known current is forced from contact I1 to I2 and the corresponding voltage drop is measured at contacts V1 and V2. The equation which governs the voltage drop is $$\rho_{WVI} = \frac{WV_{23}}{LI_{12}}$$

where DSheet is the measured sheet resistance, W is the line width, L is the spacing between the contact pads 2 and 3, V23 is the measured voltage and I14 is the measured current. Within the CD module L is set to the same value for all test structures and DSheet is determined using the van der Pauw structures. Thus equation (1) can be rearranged as $$W = \rho_{WVI} L \frac{I_{12}}{V_{23}} \quad (2)$$

Since all of the values on the right_hand_side of equation (2) are known, accurate determination of the line_width can be made.

Extraction of the sheet resistance is accomplished using the Van der Pauw structure illustrated in FIGS. 13A and 13B. In this structure a current is forced between contacts 1 and 2 while the voltage is measured between pads 3 and 4. Because the structure is symmetric, the sheet resistance can be determined using the following equation $$\rho_{VI\pi} = \frac{\pi}{\ln(2)} \frac{V_{12}}{I_{12}} \quad (3)$$

Special attention must be paid to the current used during the measurement as wafer heating (metal and silicon) and minority carrier injection (silicon) can skew the measurement results. Currents for these structures are outlined in Section 4.

3.2.3 Junction_Leakage

Figure 15A:
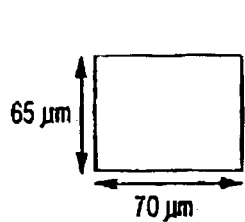
FIGS. 15A–15C show structures used to measure junction leakage in the PN CV of FIG. 5 and referenced in Table 6.
Figure 15B:
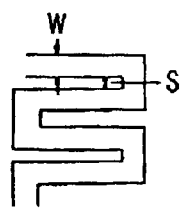
Figure 15C:

The junction_leakage module is implemented within the PN CV to resolve the measured reverse_bias leakage current into its primary components of area, perimeter and corner for both field_and gate_bounded diodes. The module also provides data on the influence of line width and pitch on the leakage current. The module consists of two identical sub-modules, NAA_JCT_LKG and PAA_JCT_LKG that incorporate N+/P and P+/N diodes, respectively. Table 6 lists the design attributes of the diodes contained within the junction_leakage module. The parameters are defined schematically in FIGS. 15A–15C. Table 6 includes a summary of junction leakage DOE in the PN-CV module.

TABLE 6

| STRUCTURE TYPE | ATTRIBUTES | NO. OF STRUCTURES | REFERENCE FIG. |
|---|---|---|---|
| NAA | A = LARGE | 2 | 15 |
| PAA | A = LARGE | 2 | 15 |
| N + Field Edge Intensive | AA-W = DR, 2 DR<br>AA-S = DR, 1.1 DR, 2 DR, 7 DR | 10 | 15 |
| P + Field Edge Intensive | AA-W = DR, 2 DR<br>AA-S = DR, 1.1 DR, 2 DR, 7 DR | 10 | 15 |
| N + Gate Edge Intensive | Poly Width = DR<br>Poly Space = DR, 1.1 DR, 2 DR | 4 | 15 |
| P + Gate Edge Intensive | Poly Width = DR<br>Poly Space = DR, 1.1 DR, 2 DR | 4 | 15 |
| NAA = N + active area<br>PAA = P + active area | DR = design rules | | |

In the leakage current analysis, area leakage is extracted using a rectangular diode with a low perimeter_to_area ratio (approximately 6%). Consequently, the measured leakage current is dominated by the diode area and is used to approximate the area leakage component. Perimeter leakage is extracted using the known area leakage current in combination with a series of diodes that incorporate varying area_to_perimeter ratios. In the perimeter analysis, the calculated area leakage current is subtracted from the leakage current measured in the perimeter structure. The residual amount of current, which can be attributed to perimeter leakage, is divided by the diode perimeter value. The resulting perimeter leakage, in units of A/$\mu$m, extracted from the diode series is compared. If the values are approximately equal, the perimeter component value is assumed correct. If the values differ significantly, a more thorough analysis must be performed in which the leakage current is expressed as a function of area, perimeter and corner for each diode and the equations are solved simultaneously. A detailed breakdown of the area (A), perimeter (P) and number of corners (C) contained in each diode is provided in Section 4.

3.2.4 Contact_and_Via

The contact_and_via module is included in the PN CV to study systematic yield issues related to each of the contact_and_via etch steps included in the CMOS1S full_flow process. The module consists of six sub-modules: CONT_NAA, CONT_PAA, CONT_NGC, VIA1, VIA2 and VIA3.

Each submodule includes 15 contact or via structures for a total of 90. The test structures are split between two designed experiments. The first measures the effects of line_width, redundancy and spacing on via yield. This DOE is given in Table 7, including DOE for contact and via module in the PN-CV. In this Table DR is the minimum design rule and WIDE denotes some value significantly larger that the minimum dimension.

TABLE 7

| LINEWIDTH | REDUNDANCY | SPACING |
|---|---|---|
| DR | 1 | DR |
| DR | 2 | DR |
| Wide | 1 | DR |
| Wide | 2 | Wide |

Figure 16:
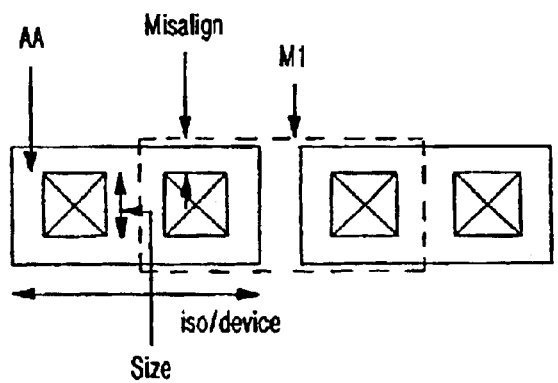
FIG. 16 shows structures used to study the alignment of contact and vias in the PN CV of FIG. 5.

The parameter space for this designed experiment is shown in Table 8, including Summary of a DOE for via mis-alignment structures in the DN-CV module. The dimensions referred to in Table 8 are defined in FIG. 16.

TABLE 8

| STRUCTURE TYPE | UPPER RUNNER | COTACT/ VIA | CONTACT/ VIA SIZE | REFERENCE FIG. |
|---|---|---|---|---|
| NAA/PAA contact | DR, DR-small, DR-larger | DR, small, larger | DR, 1.4 DR | 16 |
| Contact to poly | DR, DR-small, DR-larger | DR, DR-small, DR-larger | DR, 1.4 DR | 16 |
| Via1, Via2 | DR, DR-small, DR-larger | DR, DR-small, DR-larger | 1.4 DR, 1.6 DR | 16 |
| M3 to M4 via | DR, DR-small, DR-larger | DR, small, larger | 5 DR, 5.3 DR | 16 |
| NAA = N + active area | DR = design rules | | | |
| PAA = P + active area | | | | |
| Mk = metal layer k | | | | |

3.3 MOSCAP

The purpose of the MOSCAP module is to provide sheet resistance and capacitance measurements of individual implants not addressed in the PN CV. MOSCAP is composed of a single module containing five sheet resistance and 12 capacitor structures. The characteristics of the test structures are summarized in Table 9, including DOE for sheet resistance of source drain and capacity over implants in the DN-CV module.

TABLE 9

| STRUCTURE | ATTRIBUTE | NUMBER OF STRUCTURES | REFERENCE FIG. |
|---|---|---|---|
| Van der Pauw | S/D only, LDD only | 5 | NA |
| Contact NAA and PAA | Thinox Thinox, no channel Thinox | 6 | NA |
| NAA = N + active area | S/D = source drain Thinox = gate oxide | | |

Sheet resistance is measured using the van der Pauw technique described in Section 3.2.2. Specifically, the van der Pauw structures in the MOSCAP measure the resistance values for the deep source/drain and shallow extension implants. The capacitors are incorporated to measure the capacitance from gate_to_well and gate_to_well+channel in a standard_oxide_thickness_device as well as the capacitance from gate to well+channel for the thicker_ oxide, high_voltage transistors.

3.4 TESTCHIP

Figure 17:
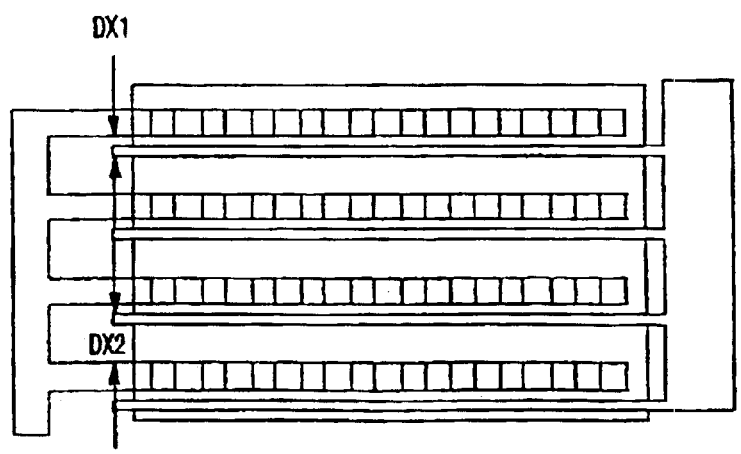
FIG. 17 shows a structure used to measure the impact of gate to contact spacing in the TESTCHIP module shown in FIG. 5.

The purpose of the TESTCHIP module is to measure the impact of gate_to_contact spacing. The module incorporates 16 devices (8 NMOS/8 PMOS) in a single column of the CV. The structure used for this characterization incorporates asymmetric contact spacing as is illustrated in FIG. 17. Table 10 gives the specific range of values for gate-to-contact spacing investigated in the experimental design.

TABLE 10

| STRUCTURE | ATTRIBUTE | NO. OF STRUCTURES | REFERENCE FIG. |
|---|---|---|---|
| NAA | DX1 = DR, 1.5 DR, 1.6 DR,1.7 DR, 1.8 DR,1.9 DR, 2 DR,2.1 DR, DX2 = 2.2 DR, 2.3 DR, 2.4 DR, 2.5 DR, 2.6 DR, 2.7 DR, 2.8 DR, 2.9 DR. | 10 | 17 |
| PAA | DX1 = DR, 1.5 DR, 1.6 DR,1.7 DR, 1.8 DR,1.9 DR, 2 DR,2.1 DR, DX2 = 2.2 DR, 2.3 DR, 2.4 DR, 2.5 DR, 2.6 DR, 2.7 DR, 2.8 DR, 2.9 DR. | 10 | 17 |
| NAA = N + active area | DX = gate to contact spacing | | |
| PAA = P + active area | DR = design rules | | |

The structure utilizes a modified comb_in_comb arrangement. Each comb structure incorporates 80 gate fingers of 57.6 $\mu$m length providing a total critical perimeter of 4608 $\mu$m. Device test is performed by placing a voltage across the gate and active contacts and measuring the current between the contacts.

4.0 Testing Procedures

In this section, testing procedures for each module in the DN/PN CV are presented. The pad arrangement and numbering, shown in FIG. 18, is the same for all submodules. The individual measurements necessary to test the DN_ and PN CVs, MOSCAP and TESTCHIP modules are addressed in Sections 4.1 through 4.4, respectively.

4.1 DN CV Measurements

In the DN CV a single lest configuration is required for all devices. Measurements are made using Toshiba standard MOS transistor current_voltage recipes which should vary the GATE and DRAIN voltages (VG and VD) while measuring the DRAIN current (ID).

For 13 of the 15 pad frames, pads <1> and <17> represent a common contact for all transistors to the WELL and SOURCE, respectively. The remaining pads are arranged in GATE_DRAIN pairs. GATE contacts occupy pads <2> through <16>, while DRAIN contacts occupy pads <18> through <32>. The GATE_DRAIN pairs are arranged as <GATE_PAD_NUMBER>_<GATE_PAD_NUMBER+16>.

The two exceptions to the standard arrangement are Column 8 and Column 15 (refer to the DN CV map provided in FIG. 1 for column numbering scheme). Column 8 contains both NMOS and PMOS transistors. As a result, pads <1> and <17> provide connections to the PMOS WELL and SOURCE, respectively, while pads <10> and <26> provide contact to the NMOS WELL and SOURCE. Since Column 15 is unfilled, the WELL and SOURCE contacts are located at pads <3> and <19>, respectively. Pads <1>,<2>,<17> and <18> are not used.

4.2 PN CV Measurements

The test configurations for each of the 17 PN CV modules is in Sections 4.2.1 through 4.2.4. For each measurement, the pads involved as well as the measurement conditions on each pad (voltages, currents, etc.) are listed.

4.2.1 Snake/comb Configuration

SNK_CMB_FLD:

| Test Name | Measurement |
|---|---|
| Test 1 | <n> to gnd, <n + 16> to $V_{DD}$, measure current flowing through <n>. n = 1 through 3. |
| Test 2 | <4> and <20> to VDD. <n> and <n − 16> to gnd, measure current flowing through <4> + <20>. n = 5 through 16 |
| Test 3 | <n> to 0.5 V and <n + 16> to gnd, measure current flowing through <n>. n = 5 through 16 |

SNK_CMB_NAA, SNK_CMB_PAA, SNK_CMB_NAA_FLD, SNK_CMB_PAA_FLD:

| Test Name | Measurement |
|---|---|
| Test 1 | Pass 500 µA between <1> and <2>, measure voltage drop between <17> and <18>. Pass 500 µA between <17> and <18>, measure voltage drop between <1> and <2>. |
| Test 2 | <4> and <20> to VDD, <n> and <n − 16> to gnd, measure current flowing through <4> + <20>. N = 5 through 16 |
| Test 3 | <n> to 0.5 V and <n + 16> to gnd, measure current flowing through <n>. n = 5 through 16 |
| Test 4 | <3> to gnd, <n> and <n + 1> to VDD, measure current through <3>. n = 5 through 16. |

4.2.2 Junction Leakage Configuration

NAA_JCT_LKG:

| Test Name | Measurement |
|---|---|
| Test 1 | Pass 10 mA between <1> and <2>, measure voltage drop between <7> and <18> Pass 10 mA between <3> and <4>, measure voltage drop between <7> and <16>. |
| Test 2 | Pass 10 mA between <2> and <3> measure voltage drop between <8> and <19>. Pass 10 mA between <18> and <19>, measure voltage drop between <2> and <3>. |
| Test 3 | <4> to VDD. <n> to gnd, measure current flowing through <n>. n = 5 through 7, 16, 24 through 31. |

PAA_JCT_LKG:

| Test Name | Measurement |
|---|---|
| Test 1 | Pass 10 mA between <1> and <2>, measure voltage drop between <17> and <18>. Pass 10 mA between <3> and <4>, measure voltage drop between <17> and <18>. |
| Test 2 | Pass 10 mA between <2> and <3>, measure voltage drop between <18> and <19>. Pass 10 mA between <18> and <19>, measure voltage drop between <2> and <3>. |
| Test 3 | <4> to gnd, <n> to VDD, measure current flowing through <n>. n = 5 through 7, 16, 24 through 31. |

4.2.3 Contact/via Chain Configuration

CONT_NAA, CONT_PAA, CONT_NGC, VIA2, VIA3:

| Test Name | Measurement |
|---|---|
| Test 1 | <1> to gnd, <17> to $V_{DD}$, measure current flowing through <1>. |
| Test 2 | <n> to gnd, <n − 16> to VDD, measure current flowing through <n>. n = 2 through 16 |

VIA1:

| Test Name | Measurement |
|---|---|
| Test 1 | <n> to gnd, <n + 16> to VDD, measure current flowing through <n>. n = 2 through 16 |

4.2.4 Kelvin Configuration

KELVIN_NGC_M1:

| Test Name | Measurement |
|---|---|
| Test 1 | Pass 1 mA from <n> to <n + 16>, measure voltage across <1> and <17>. n = 2 through 6 |
| Test 2 | Pass 1 mA from <n> to <n + 16> measure voltage across <7> and <23>. n = 8 through 16 |

KELVIN_PGC_M1:

| Test Name | Measurement |
|---|---|
| Test 1 | <1> to gnd, <17> to $V_{DD}$, measure current flowing through <1> |
| Test 2 | Pass 1 mA from <n> to <n + 16>, measure voltage across <12> and <28>. n = 13 through 16 |
| Test 3 | Pass 0.1 mA from <n> to <n + 16>, measure voltage across <2> and <18>. n = 3 through 11 |

KELVIN_M2_M3:

| Test Name | Measurement |
|---|---|
| Test 1 | Pass 1 mA from <n> to <n + 16> to VDD, measure voltage across <1> and <17>, n = 2 through 6 |
| Test 2 | Pass 0.1 mA from <n> to <n + 16> to VDD, measure voltage across <7> and <23>. n = 8 through 16 |

KELVIN_M3_M4:

| Test Name | Measurement |
|---|---|
| Test 1 | <1> to gnd, <17> to $V_{DD}$, measure current flowing through <1> |
| Test 2 | Pass 1 mA from <n> to <n + 16>, measure voltage across <2> and <18>. n = 3 through 11 |
| Test 3 | Pass 1 mA from <n> to <n + 16> measure voltage across <12> and <28>. n = 13 through 16 |

4.3 MOSCAP Measurements

In the MOSCAP one test configuration is required. This configuration is shown in below.

| Test Name | Measurement |
| --- | --- |
| Test 1 | <1> and <17> to VDD, Pass 100 µA between <2> and <3>, measure voltage drop between <18> and <19>. <1> and <17> to VDD, Pass 100 µA between <18> and <19>, measure voltage drop between <2> and <3>. |
| Test 2 | <1> and <17> to VDD, Pass 100 µA between <3> and <19>, measure voltage drop between <4> and <20>. <1> and <17> to VDD, Pass 100 µA between <4> and <20>, measure voltage drop between <3> and <19> |
| Test 3 | <6> and <22> to gnd, Pass 100 µA between <4> and <5>, measure voltage drop between <20> and <21>. <6> and <22> to gnd, Pass 100 µA between <20> and <21>, measure voltage drop between <4> and <6>. |
| Test 4 | <6> and <22> to gnd, Pass 100 µA between <7> and <6>, measure voltage drop between <23> and <24>. <6> and <22> to gnd, Pass 100 µA between <23> and <24>, measure voltage drop between <7> and <8> |
| Test 5 | <6> and <22> to gnd, Pass 100 µA between <19> and <6>, measure voltage drop between <9> and <20> <6> and <22> to gnd, Pass 100 µA between <9> and <20>, measure voltage drop between <8> and <19>. |
| Test 6 | Measure Low Frequency and High Frequency CV between <n> and <n + 16>. n = 11, 13, 15, N + gate to PWELL. |
| Test 7 | Measure Low Frequency and High Frequency CV between <n> and <n + 16>. n = 12, 14, 16. P + gate to NWELL. |

4.4 TESTCHIP Measurements

In the TESTCHIP one test configuration is required. This configuration is shown in below.

| Test Name | Measurement |
| --- | --- |
| Test 1 | <n> to gnd, <n + 16> to $V_{DD}$, measure current flowing through <n>. n = 1 through 16. |

By including both the device neighborhood and process neighborhood modules on a single die, device measurements can be correlated with the process neighborhood measurements, so that simulation models used to infer device performance can be verified.

Other characterization vehicles for via, device, suicides, poly, et al, are often designed and utilized. However, the procedure and techniques for designing them are the same. For purposes of illustration, the example metal characterization vehicle will be carried through on extraction engines and yield models.

Reference is again made to FIGS. 1 and 2. The extraction engine 18 has two main purposes: (1) it is used in determining the range of levels (e.g. linewidth, linespace, density) to use when designing a characterization vehicle. (2) It is used to extract the attributes of a product layout which are then subsequently used in the yield models to predict yield. (1) has already been described above with reference to how the line width, space and density of the snake, comb and Kelvin structures were chosen in the example characterization vehicle. Thus, most of the following discussion focuses on (2).

Since there are nearly infinite numbers of attributes that can be extracted from the product layout, it is impossible to list or extract all of them for each product. Thus, a procedure is required to guide which attributes should be extracted. Usually, the characterization vehicle drives which attributes to extract. The process consists of:

1. List all structures in the characterization vehicle
2. Classify each structure into groups or families such that all structures in the family form an experiment over a particular attribute. For example, in the metal characterization vehicle discussed above, a table of family classifications might be:

| Family | Attributes Explored |
| --- | --- |
| Nest structures | Basic defectivity over a few linewidths and spaces |
| Snakes and Combs | Yield over wide range of linewidths and spaces including very large widths next to small spaces and very large spaces next to small widths. |
| Kelvin_CD + van der Pauws | CD variation across density, linewidth, and linespace. |
| Border structures | Effect of different OPC schemes on yield. |

3. For each family, determine which attributes must be extracted from the product layout. The exact attributes to choose are driven from which attributes are explored. For example, if a particular family explores yield over different ranges of space, then either a histogram of spaces or the shortable area for each space must be extracted. For the above example, the required list of attributes might be:

| Family | Attributes Explored | Attributes to Extract from Product Layout |
| --- | --- | --- |
| (A) Nest structures | Basic defectivity over a few linewidths and spaces. | Critical area curves. |
| (B) Snakes and combs | Yield over wide range of linewidths and spaces including... | Shortable area and/or instance counts for each line width and space explored in the characterization vehicle. |
| (C) Kelvin_CD and van der Pauws | CD variation across density, linewidth, and space | Histograms of pattern density, linewidth, and linespace |

4. Use the attributes extracted in the appropriate yield models as previously described.

For other characterization vehicles, the families and required attributes will obviously be different. However, the procedure and implementation is similar to the example described above.

As stated above, the yield model 16 is preferably constructed from data measured from at least a portion of a wafer which has undergone the selected fabrication process steps using the reticle set defined by the characterization vehicle 12. In the preferred embodiment, the yield is modeled as a product of random and systematic components:

$$Y = \left(\prod_{i=1}^{n} Y s_i\right)\left(\prod_{j=1}^{n} Y r_j\right)$$

The methods and techniques for determining $Ys_i$ and $Yr_j$ are as follows.

Systematic Yield Modeling

Since there are so many types of systematic yield loss mechanisms and they vary from fab to fab, it is not practicable to list every possible systematic yield model. However, the following describes two very general techniques and gives an example of their use especially within the context of characterization vehicles and the methodology described herein.

Area Based Models

The area based model can be written as:

$$Y_{S_i} = \left[\frac{Y_o(q)}{Y_r(q)}\right]^{A(g)/A_o(g)}$$

Where q is a design factor explored in the characterization vehicle such as line width, line space, length, ratio of width/space, density, etc. $Y_o(q)$ is the yield of a structure with design factor q from the characterization vehicle. $A_o(q)$ is the shortable area of this structure and $A(q)$ is the shortable area of all instances of type q on the product layout. $Y_r(q)$ is the predicted yield of this structure assuming random defects were the only yield loss mechanism. The procedure for calculating this quantity is described below in connection with random yield modeling.

Figure 19:
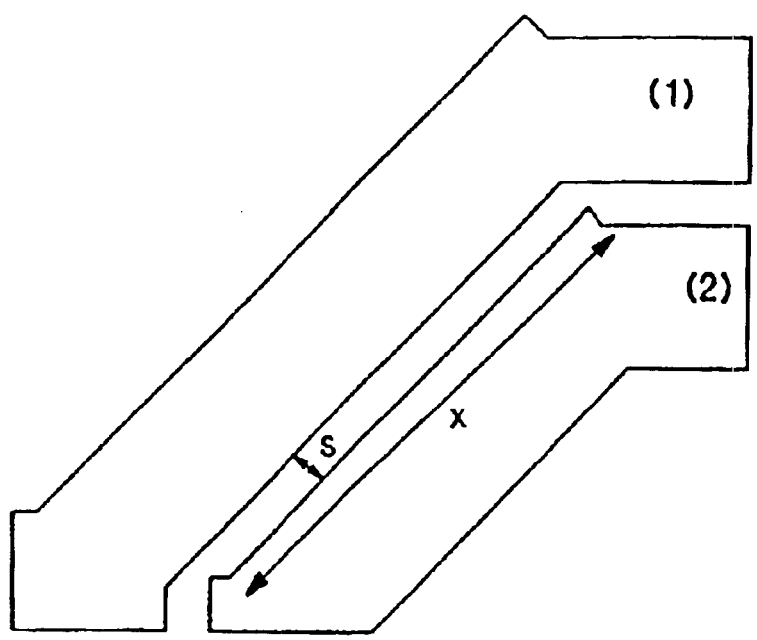
FIG. 19 is a diagram showing definitions of "shortable area" in a characterization vehicle.

The definition of shortable area is best illustrated with the example shown in FIG. 19. This type of test structure can be used to determine if the fab is capable of yielding wide lines that have a bend with a spacing of s. In this sample test structure, a short is measured by applying a voltage between terminal (1) and (2) and measuring the current flowing from terminal (1) to (2). If this current is larger than a specified threshold (usually 1–100 nA), a short is detected. The shortable area is defined to be the area where if a bridging occurs, a short will be measured. In the example of FIG. 19, the shortable area is approximately x*s). The $A(q)$ term is the shortable area of all occurrences of the exact or nearly exact pattern (i.e. a large line with a spacing of s and a bend of 45 degrees) shown in FIG. 19 in a product layout. The $Y_r(q)$ term is extracted by predicting the random yield limit of this particular structure using the critical area method described below.

It is important to realize that the effectiveness of this model is only as good as the number of structures and size of structures placed on the characterization vehicle. For example, if the angled bend test structure shown in FIG. 19 were never put on the characterization vehicle or was not placed frequently enough to get a meaningful yield number, then there would be no hope of modeling the yield loss of wide line bends on the product layout. While it is difficult to define exactly how many of how big the test structure should be on the characterization vehicle, practical experience has shown that the total shortable area of each test structure on the characterization vehicle should ideally be such that $A(q)/A_o(q) < 10$.

The above discussion has concentrated on shorts since they generally tend to dominate over open yield loss mechanisms. However, open yield loss mechanisms can be modeled equally well with this yield model so long as shortable area is replaced by open causing area.

Instance Based Yield Model

The general form of the instance based yield model is:

$$Y_{S_i} = \left[\frac{Y_o(q)}{Y_r(q)}\right]^{N_i(g)/N_o(g)}$$

Where $Y_o(q)$ and $Y_r(q)$ are exactly the same as in the area based yield model. $N_i(q)$ is the number of times the unit cell pattern or very similar unit cell pattern to the test pattern on the characterization vehicle appears on the product layout. $N_o(q)$ is the number of times the unit cell pattern appears on the characterization vehicle.

Figure 20:
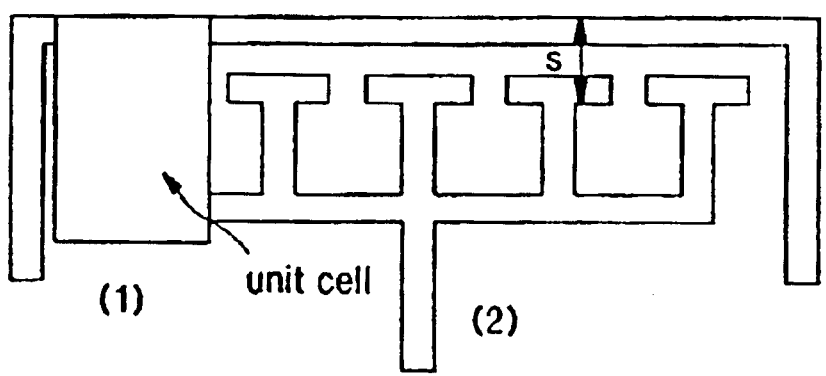
FIG. 20 is a diagram showing a test pattern for analyzing yield of T-shaped endings.

For example, FIG. 20 shows a simple test pattern for examining the yield of T-shaped endings at the ends of lines near a space of s. This test pattern is measured by applying a voltage across terminals (1) and (2) and measuring the shorting current. If this pattern was repeated 25 times somewhere on the characterization vehicle, then $N_o(q)$ would be 25×5=125 since there are five unit cells per each test structure.

If the number of times this unit cell occurs with a spacing of s near it is extracted from the product layout, the systematic yield of this type of structure can be predicted. For example, if there are five structures with 500 unit cells in each structure then $N_o(q)=2500$. If $N_i(q)$ from some product was 10,000 and a yield of the test structures on the characterization vehicle of 98.20% was measured. Using the techniques described below, $Y_r(q)$ can be estimated as 99.67%. Using these numbers in the equation:

$$Y_{S_i} = \left[\frac{0.9820}{0.9967}\right]^{10000/2500} = 92.84\%$$

Random Yield Modeling

The random component can be written as:

$$Y_r = e^{-\int_{x_D}^{\infty} CA(x) \times DSD(x) dx}$$

Where $CA(x)$ is the critical area of defect size x and $DSD(x)$ is the defective size distribution, as also described in "Modeling of Lithography Related Yield Losses for CAD of VSLI Circuits", W. Maly, IEEE Trans. on CAD, July 1985, pp161–177, which is incorporated by reference as if fully set forth herein. Xo is the smallest defect size which can be confidently observed or measured. This is usually set at the minimum line space design rule. The critical area is the area where if a defect of size x landed, a short would occur. For very small x, the critical area is near 0 while very large defect sizes have a critical area approaching the entire area of the chip. Additional description of critical area and extraction techniques can be found in P. K. Nag and W. Maly, "Yield Estimation of VLSI Circuits," Techcon90, Oct. 16–18, 1990. San Jose; P. K. Nag and W. Maly, "Hierarchical Extraction of Critical Area for Shorts in Very Large ICs," in Proceedings of The IEEE International Workshop on Detect and Fault Tolerance in VLSI Systems, IEEE Computer Society Press 1995, pp. 10–18; I. Bubel, W. Maly, T. Waas, P. K. Nag, H. Hartmann, D. Schmitt-Landsiedel and S. Griep, "AFFCCA: A Tool for Critical Area Analysis with Circular Defects and Lithography Deformed Layout," in Proceedings of The IEEE International Workshop on Detect and Fault Tolerance in VLSI Systems, IEEE Computer Society Press 1995, pp. 19–27; C. Ouyang and W. Maly, "Efficient Extraction of Critical Area in Large VISI ICs," Proc. IEEE International Symposium on Semiconductor Manufacturing, 1996, pp. 301–304; C. Ouyang, W. Pleskacz, and W. Maly, "Extraction of Critical Area for Opens in Large VLSI Circuits," Proc. IEEE International Workshop on Defect and Fault Tolerance of VLSI Systems, 1996, pp. 21–29, all of which references are incorporated in this detailed description as if fully set forth herein.

The defect size distribution represents the defect density of defects of size x. There are many proposed models for defect size distributions (see, for example, "Yield Models—Comparative Study", W. Maly, Defect and Fault Tolerance in VLSI Systems, Ed. by C. Stapper, et al, Plenum Press, New York, 1990; and "Modeling of Integrated Circuit Defect Sensitivities", C. H. Stapper, IBM J. Res. Develop., Vol. 27, No. 6, November, 1983, both of which are incorporated by reference as if fully set forth herein), but for purposes of illustrations, the most common distribution:

$$DSD(x) = \frac{D_o \times k}{x^P}$$

will be used where Do represents the total number of defects/cm$^2$ greater than $x_o$ observed. P is a unitless value which represents the rate at which defects decay over size. Typically, p is between 2 and 4. K is a normalization factor such that $$\int_{x_o}^{\infty} \frac{k}{x^P} dx = 1$$

The following two sections describe techniques for extracting defect size distributions from characterization vehicles.

The Nest Structure Technique

Figure 21:
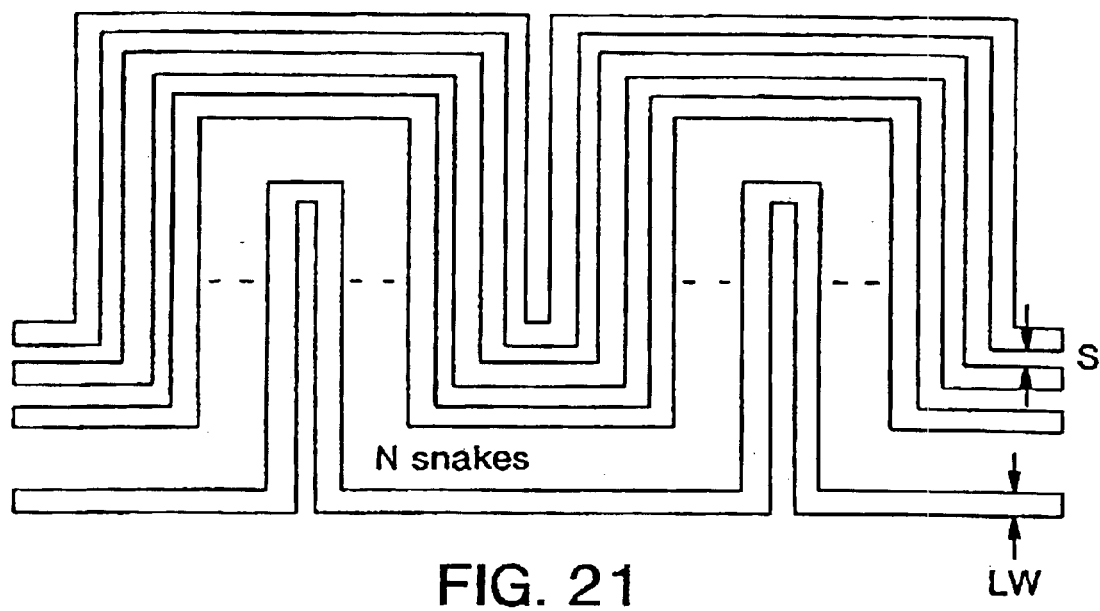
FIG. 21 is a diagram of a nest structure for extracting defect size distributions.

The nest structure is designed for extracting defect size distributions. It is composed of N lines of width w and space s as shown in FIG. 21. This structure is tested by measuring the shorting current between lines 1 and 2, 2 and 3, 3 and 4, ..., and N−1 and N. Any current above a given spec limit is deemed a short. In addition, opens can be testing by measuring the resistance of lines 1, 2, 3, ..., N−1, and N. Any resistance above a certain spec limit is deemed to be an open line. By examining how many lines are shorted together the defect size distribution can be determined.

If only two lines are shorted then the defect size must be greater than s and no larger than 3w+2s. Any defects smaller than s will not cause a short at all while defects larger than 3w+2s are guaranteed to cause a short of at least 3 lines. For each number of lines shorted, an interval of sizes can be created:

| Number Lines Shorted | Size Interval |
|---|---|
| 2 | s to 3w + 2s |
| 3 | 2s + w to 3s + 4w |
| 4 | 3s + 2w to 4s + 5w |
| ... | ... |
| N | (N − 1)s + (N − 2)w to (N)s + (N + 1)w |

It should be noted that the intervals overlap; thus, a defect size distribution cannot be directly computed. This restriction only places a limit on p extraction. Thus, in order to estimate p, a p estimate is computed from the distribution from all the even number lines and then from all the odd number lines. Finally, the two values are averaged together to estimate p. To extract p, the ln (number of faults for x lines shorted) vs log ([x−1]s+[x−2]w) is plotted. It can be shown that the slope of this line is −p. The Do term is extracted by counting the number of failures at each grouping of lines and dividing by the area of the structure. However, for very large Do, this estimate will be too optimistic. Additional information on extracing defect size distribution from structures similar to the test structures can be found, for example, in "Extraction of Defect Size Distribution in an IC Layer Using Test Structure Data", J. Khare, W. Maly and M. E. Thomas, IEEE Transactions on Semiconductor Manufacturing, pp. 354–368, Vol. 7, No. 3, August, 1994, which is incorporated by reference as if fully set forth herein.

As an example, consider the following data taken from 1 wafer of 100 dies:

| Number Lines Shorted | Number of Failures |
|---|---|
| 2 | 98 |
| 3 | 11 |
| 4 | 4 |
| 5 | 2 |
| 6 | 1 |
| 7 | 0 |
| 8 | 0 |

Figure 22:
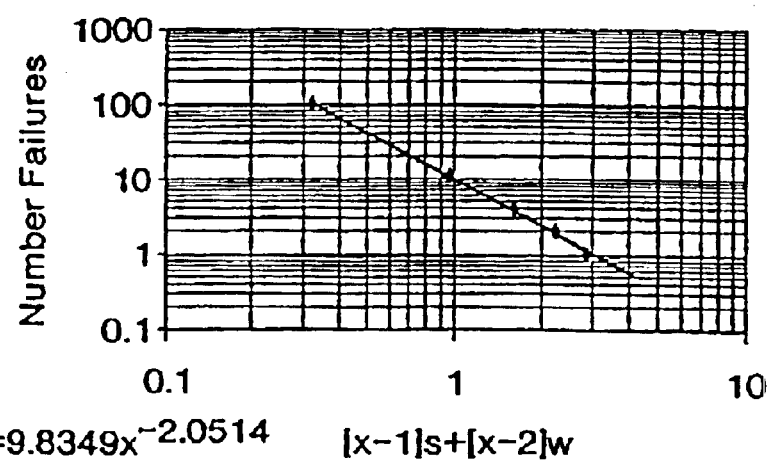
FIG. 22 is a logarithmic diagram of failures plotted against a parameter relating to number of lines shorted, line spacing, and width.

If the structure size is 1 cm$^2$ then the Do would be 98+11+4+2+1=133/(100*1)=1.33 defects/cm$^2$. Also, the plot of log (number of failures) vs log ([x−1]s+[x−2]w) (see FIG. 22) shows that p=2.05.

The Comb Structure Technique

Assuming a comb of width=space=s, it can be shown that the yield of this structure can be written as:

$$\ln[|\ln(Y)|] = \ln\left[-\int_{x_o}^{\infty} DSD(x) \times CA(x) dx\right] \propto (1 - p) \times \ln(g)$$

Thus, from the slope of the plot of ln[|ln(Y)|] vs. ln(s), p can be estimated. The Do extraction technique is the same technique as mentioned above.

Yield Impact and Assessment

Once a sufficient number of characterization vehicles has been run and yield estimates are made for each characterization vehicle, the results are placed in a spread sheet to enable prioritization of yield activities. Tables XIV through XVI are examples of information contained in such a spread sheet. It has been divided into sections of metal yield, poly and active area (AA) yield (Table XIV), contact and via yield (Table XV), and device yield (Table XVI). The columns on the left indicate systematic yield loss mechanisms while the columns on the right indicate random yield loss mechanisms. Although the exact type of systematic failure mechanisms vary from product to product and technology by technology, examples are shown in Tables XIV through XVI.

Usually, targets are ascribed to each module listed in the spread sheet. The further a module yield is away from a target, the more emphasis and resources are devoted to fixing the problem. For example, if the target was set artificially at 95 percent for each module in the example shown in Tables XIV through XVI, then clearly ($M_2 \rightarrow M_3$) vias (75.12%) followed by similar vias ($M_1 \rightarrow M_2$) (81.92%). $M_1$ shorts (82.25%), and contacts to poly (87.22%) are below target and, with vias ($M_2 \rightarrow M_3$) needing the most amount of work and contacts to poly needing the least amount of work.

Within each module, it is also possible to tell where the greatest yield loss is situated. That is, is it one particular systematic mechanism being the yield down or is it merely a random defectivity problem, or is it some combination of the two? For example, as shown in Table XV, via ($M_2 \rightarrow M_3$) yield loss is clearly dominated by a systematic problem affecting vias connected to long metal runners on the $M_3$ level (77.40%). Vias from ($M_1 \rightarrow M_2$) are affected by the same problems (91.52%) in addition to a random defectivity problem (92.49%). Solving vias ($M_1 \rightarrow M_2$) yield problems would require fixing both of these problems.

As shown in Table XIV, $M_1$ yield loss is also dominated by a random defectivity issue (85.23%) in addition to a systematic problem affecting wide lines near small spaces (96.66%). Fixing both of these problems would be required for improving Metal 1. Similar conclusions can be made for other modules in the spread sheet.

For the worst yielding modules, frequent running of further characterization vehicles for this module would be required. Usually, splits will be done on these characterization vehicles to try and improve and validate those improvements in module yield. For the modules which are within target, routine monitoring of short flow characterization vehicles would still be required to validate that there has been no down turn or other movement in module yield. However, these characterization vehicles can be run less frequently than for those modules with known problems.

Not furnished at time of publication

Not furnished at time of publication

TABLE XIV

|  | Systematic Yield Loss Mechanisms | | | Random Yield Loss Mechanism | | | |
| --- | --- | --- | --- | --- | --- | --- | --- |
|  | Shortable Area(cm^) | Instant Count | Estimated Yield | Do | P | Estimated Yield | |
| *Open and Shorts (Metal Layers)* | | | | | | | |
| Metal-1 | | | | | | | |
| Random Yield |  |  |  | 0.7 defects/cm^2 | 2.3 | 85.23% | |
| Wide lines near small space | 0.034 |  | 96.66% |  |  |  | |
| Wide space near small lines | 0.00014 |  | 99.99% |  |  |  | |
| Yield for OPC structures |  | 72,341 | 99.86% |  |  |  | |
| Bent lines |  | 492 | 100.00% |  |  |  | |
| Total for M1 |  |  |  |  |  | 82.25% | |
| Metal-2 | | | | | | | |
| Random Yield |  |  |  | 0.35 defects/cm^2 | 1.92 | 97.45% | |
| Wide lines near small space | 0.00079 |  | 99.92% |  |  |  | |
| Wide space near small lines | 0.000042 |  | 100.00% |  |  |  | |
| Yield for OPC structures |  | 1040372 | 97.94% |  |  |  | |
| Bent lines |  | 103 | 100.00% |  |  |  | |
| Total for M2 |  |  |  |  |  | 95.36% | |
| Metal-3 | | | | | | | |
| Random Yield |  |  |  | 0.25 defects/cm^2 | 2.02 | 96.92% | |
| Wide lines near small space | 0.0000034 |  | 100.00% |  |  |  | |
| Wide space near small lines | 0 |  | 100.00% |  |  |  | |
| Yield for OPC structures |  | 352 | 100.00% |  |  |  | |
| Bent lines |  | 7942 | 99.92% |  |  |  | |
| Total for M3 |  |  |  |  |  | 96.84% | |
| *Open and Shorts (Poly and AA Layer)* | | | | | | | |
| Poly | | | | | | | |
| Random Yield (without silicide) |  |  |  | 0.17 defects/cm^2 | 2.03 | 99.81% | |
| Random Yield (with silicide) |  |  |  | 4.34 defects/cm^2 | 4.56 | 89.54% | 89.71% from silicide |
| Wide lines near small space | 0 |  | 100.00% |  |  |  | |
| Wide space near small lines | 0.01203 |  | 98.80% |  |  |  | |
| Yield for OPC structures |  | 0 | 100.00% |  |  |  | |
| Bent lines |  | 786541 | 92.44% |  |  |  | |
| Over wide AA | 0.034 |  | 96.66% |  |  |  | |
| Over narrow AA | 0.101 |  | 99.00% |  |  |  | |
| Total for Poly |  |  |  |  |  | 87.22% | |
| AA | | | | | | | |
| Random Yield (without silicide) |  |  |  | 1.3 | 3.45 | 99.12% | |
| Random Yield (with silicide) |  |  |  | 1.7 | 3.02 | 98.72% | 99.60% |

TABLE XIV-continued

| | Systematic Yield Loss Mechanisms | | | Random Yield Loss Mechanism | | | |
|---|---|---|---|---|---|---|---|
| | Shortable Area(cm^) | Instant Count | Estimated Yield | Do | P | Estimated Yield | |
| Wide lines near small space | | 10952 | 99.96% | | | | from silicide |
| Wide space near small lines | | 0 | 100.00% | | | | |
| Total for AA | | | | | | 98.70 | |

TABLE XV

Contacts and Vias

| | Systematic Yield Loss Mechanisms | | | Random Yield Loss Mechanism | | | |
|---|---|---|---|---|---|---|---|
| | Shortable Area(cm^2) | Instant Count | Estimated Yield | Fault Rate | Number | Estimated Yield | |
| Contact to Poly | | | | | | | |
| Random Yield (without silicide) | | | | 2.02E-09 | 3270432 | 99.28% | |
| Random Yield (with silicide) | | | | 3.10E-09 | 3270432 | 98.99% | 99.71% |
| Yield for Long Runners (on M1) | | 11,921 | 100.00% | | | | |
| Yield for Long Runners (on Poly) | | 0 | 100.00% | | | | |
| Yield for Redundant Vias | | 39421 | 100.00% | | | | |
| Yield for very isolated contacts | | 7200 | 96.46% | | | | |
| Total for Contact to Poly | | | | | | 94.80% | |
| Contact to n + AA | | | | | | | |
| Random Yield (without silicide) | | | | 2.20E-09 | 5270432 | 98.85% | |
| Random Yield (with silicide) | | | | 3.10E-09 | 5270532 | 98.38% | 99.53% |
| Yield for Long Runners (on M1) | | 75,324 | 99.99% | | | | |
| Yield for Long Runners (on n + AA) | | 0 | 100.00% | | | | |
| Yield for Redundant Vias | | 4032007 | 99.60% | | | | |
| Yield for very isolated contacts | | 7200 | 99.93% | | | | |
| Total for Contact to AA (n+) | | | | | | 96.78% | |
| Contact to | | | | | | | |
| Random Yield (without silicide) | | | | 2.20E-09 | 6093450 | 98.67% | |
| Random Yield (with silicide) | | | | 3.10E-09 | 6093450 | 98.13% | |
| Yield for Long Runners (on M1) | | 96,732 | 99.99% | | | | |
| Yield for Long Runners (on p + AA) | | 0 | 100.00% | | | | |
| Yield for Redundant Vias | | 39421 | 100.00% | | | | |
| Yield for very isolated contacts | | 7200 | 99.93% | | | | |
| Total for Contact to AA (p+) | | | | | | 96.74% | |
| Vias M1→M2 | | | | | | | |
| Random Yield (single vias) | | | | 1.10E-08 | 7093210 | 92.49% | |
| Yield for Long Runners (M2) | | 88640 | 91.52% | | | | |
| Yield for Long Runners (M1) | | 97645 | 99.03% | | | | |
| Yield for Redundant Vias | | 11003456 | 96.91% | | | | |
| Yield for Isolated Vias | | 119582 | 96.81% | | | | |
| Total for Via M1-M2 | | | | | | 81.92% | |

TABLE XV-continued

Contacts and Vias

| | Systematic Yield Loss Mechanisms | | | Random Yield Loss Mechanism | | |
|---|---|---|---|---|---|---|
| | Shortable Area(cm^2) | Instant Count | Estimated Yield | Fault Rate | Number | Estimated Yield |
| Vias M2→ | | | | | | |
| Random Yield (single vias) | | | | 3.10E-09 | 4002063 | 98.77% |
| Yield for Long Runners (M3) | | 256128 | 77.40% | | | |
| Yield for Long Runners (M2) | | 103432 | 96.97% | | | |
| Yield for Redundant Vias | | 7096230 | 99.29% | | | |
| Yield for Isolated Vias | | 1024 | 99.99% | | | |
| Total for Via M2-M3 | | | | | | 75.12% |

TABLE XVI

Devices

| | Systematic Yield Loss Mechanisms | | | Random Yield Loss Mechanism | | |
|---|---|---|---|---|---|---|
| | Shortable Area (cm^2) | Insant Count | Estimated Yield | Fault Rate | Number | Estimated Yield |
| NMOS | | | | | | |
| Random Yield (Logic Xtor) | | | | 2.90E-09 | 1395228 | 99.60% |
| Random Yield (SRAM Xtor) | | | | 2.80E-09 | 2226720 | 99.38% |
| S/D Shorts | | | | 1.00E-09 | 3621948 | 99.64% |
| Bent Transistors | | 1113360 | 99.89% | | | |
| Near Large AA | | 754000 | 99.92% | | | |
| Near Small AA | | 1023452 | 99.90% | | | |
| Total for NMOS Transistors | | | | | | 98.33% |
| PMOS | | | | | | |
| Random Yield (Logic Xtor) | | | | 1.80E-09 | 1491003 | 99.73% |
| Random Yield (SRAM Xtor) | | | | 3.10E-09 | 1113360 | 99.66% |
| S/D Shorts | | | | 9.00E-10 | 2604363 | 99.77% |
| Bent Transitors | | 556680 | 99.94% | | | |
| Near large AA | | 789092 | 99.92% | | | |
| Near Small AA | | 1309970 | 99.87% | | | |
| Total for PMOS Transistors | | | | | | 98.89% |

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

We claim:

1. A characterization vehicle, comprising:
a single die including a device neighborhood testing module for allowing measurement of variations in electrical performance of an active device due to a first plurality of process variations within the active device and a second plurality of process variations affecting an area surrounding the active device, the device neighborhood testing module including:
said active test device; and
an array of dummy devices within which the active test device is located.

2. The characterization vehicle of claim 1, wherein the device neighborhood testing module includes a plurality of devices having respectively different active area densities.

3. The characterization vehicle of claim 1, wherein the device neighborhood testing module includes a plurality of devices having respectively different polysilicon densities.

4. The characterization vehicle of claim 1, wherein the device neighborhood testing module includes a plurality of devices, each having a respectively different spacing between a contact and a polysilicon region.

5. The characterization vehicle of claim 1, wherein the device neighborhood testing module includes a plurality of devices, each having a respectively different spacing between polysilicon regions.

6. The characterization vehicle of claim 1, wherein the device neighborhood testing module includes a plurality of devices, each having a respectively different spacing between contacts.

7. The characterization vehicle of claim 1, wherein the single die further comprises process neighborhood testing means for allowing measurement of variations in yield of a product due to a second plurality of within-die pattern variations.

8. The characterization vehicle of claim 7, wherein the process neighborhood testing means include a plurality of snake and comb structures arranged to enable measurement of the extent to which polysilicon and active-area pitch cause polysilicon bridging.

9. The characterization vehicle of claim 7, wherein the process neighborhood testing means include a plurality of snake and comb structures arranged to enable measurement of the extent to which polysilicon and active-area pitch cause polysilicon bridging.

10. The characterization vehicle of claim 7, wherein the process neighborhood testing means include a plurality of structures configured to enable measurement of the effects of etch loading on a plurality of critical dimensions.

11. The characterization vehicle of claim 7, wherein the process neighborhood testing means include a plurality of structures configured to enable measurement of the effects of etch loading on sheet resistance.

12. The characterization vehicle of claim 7, wherein the process neighborhood testing means include a plurality of structures configured to enable measurement of the effects of etch loading on sheet resistance.

13. The characterization vehicle of claim 7, wherein the process neighborhood testing means include a plurality of structures, each including a rectangular diode having a low permeter-to-area ratio.

14. The characterization vehicle of claim 13, wherein the plurality of structures further includes a plurality of diodes that have respectively different area-to-perimeter ratios.

15. The characterization vehicle of claim 7, wherein the process neighborhood testing means include a plurality of structures configured to enable measurement of the effects of line-width, redundancy and line spacing on via yield.

16. The characterization vehicle of claim 1, wherein the dummy devices are dummy transistors, and the device neighborhood testing module includes:

a plurality of devices having respectively different active area densities;

a plurality of devices having respectively different polysilicon densities;

a plurality of devices, each having a respectively different spacing between a contact and a polysilicon region;

a plurality of devices, each having a respectively different spacing between polysilicon regions; and a plurality of devices, each having a respectively different spacing between contacts.

17. The characterization vehicle of claim 16, wherein the single die further comprises process neighborhood testing means for allowing measurement of variations in yield of a product due to a second plurality of within-die pattern variations.

18. The characterization vehicle of claim 17, wherein the process neighborhood testing means include:

a plurality of snake and comb structures arranged to enable measurement of the extent to which polysilicon and active-area pitch cause polysilicon bridging;

a plurality of structures configured to enable measurement of the effects of etch loading on a plurality of critical dimensions;

a plurality of structures configured to enable measurement of the effects of etch loading on sheet resistance;

a plurality of structures, each including a rectangular diode having a low permeter-to-area ratio;

a plurality of diodes that have respectively different area-to-perimeter ratios; and a plurality of structures configured to enable measurement of the effects of line-width, redundancy and line spacing on via yield.

19. The characterization vehicle of claim 1, wherein the single die further comprises a plurality of comb-in-comb structures having asymmetric gate-to-contact spacing.

20. A system for predicting yield of integrated circuits comprising:

a) at least one type of characterization vehicle including means for allowing measurement of variations in yield of an integrated circuit due to a plurality of within-die pattern variations;

b) a yield model which embodies a layout as defined by the characterization vehicle, said yield model having been subjected to at least one of a plurality of process operations making up a fabrication cycle to be used in fabricating a final integrated circuit product;

c) a product layout; and d) an extraction engine for extracting predetermined layout characteristics from the product layout, which characteristics are used in connection with the yield model to produce a yield prediction.

* * * * *